United States Patent
Yoon et al.

(10) Patent No.: US 10,192,823 B2
(45) Date of Patent: Jan. 29, 2019

(54) SEMICONDUCTOR DEVICE AND METHOD OF MANUFACTURING THE SAME

(71) Applicant: Samsung Electronics Co., Ltd., Suwon-si (KR)

(72) Inventors: Jihoon Yoon, Seoul (KR); Shincheol Min, Seoul (KR); Hyun-Min Choi, Uiwang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/229,518

(22) Filed: Aug. 5, 2016

(65) Prior Publication Data

US 2017/0069570 A1 Mar. 9, 2017

(30) Foreign Application Priority Data

Sep. 8, 2015 (KR) ........................ 10-2015-0127135

(51) Int. Cl.
| | | |
|---|---|---|
| *H01L 23/62* | (2006.01) | |
| *H01L 23/525* | (2006.01) | |
| *H01L 27/112* | (2006.01) | |
| *H01L 21/66* | (2006.01) | |
| *H01L 27/11582* | (2017.01) | |

(52) U.S. Cl.
CPC .......... *H01L 23/5256* (2013.01); *H01L 22/14* (2013.01); *H01L 27/11206* (2013.01); *H01L 27/11582* (2013.01)

(58) Field of Classification Search
CPC .......................... H01L 23/5256; H01L 21/768
See application file for complete search history.

(56) References Cited

U.S. PATENT DOCUMENTS

| | | | |
|---|---|---|---|
| 8,035,191 B2 | 10/2011 | Lin et al. | |
| 8,236,655 B2 | 8/2012 | Barth et al. | |
| 8,349,665 B2 | 1/2013 | Kim | |
| 8,723,290 B2 | 5/2014 | Shin et al. | |
| 8,809,142 B2 | 8/2014 | Kim et al. | |
| 8,847,350 B2 | 9/2014 | Lin et al. | |
| 9,006,794 B1* | 4/2015 | Xie | H01L 23/5256 257/202 |
| 2003/0162383 A1* | 8/2003 | Yamaya | H01L 22/32 438/622 |
| 2007/0007621 A1* | 1/2007 | Omura | H01L 23/5256 257/529 |
| 2010/0148915 A1* | 6/2010 | Kuo | H01L 23/5256 337/290 |
| 2014/0332923 A1 | 11/2014 | Filippi et al. | |
| 2014/0370671 A1 | 12/2014 | Li et al. | |
| 2015/0097266 A1 | 4/2015 | Li et al. | |
| 2015/0102458 A1 | 4/2015 | Choi et al. | |

FOREIGN PATENT DOCUMENTS

KR 0688475 3/2007

* cited by examiner

*Primary Examiner* — Cuong B Nguyen
*Assistant Examiner* — Samuel Park
(74) *Attorney, Agent, or Firm* — Onello & Mello, LLP

(57) ABSTRACT

In a semiconductor device and a method of manufacturing the same a fuse structure may be formed during formation of first to third contact plugs connected to a transistor. The fuse structure may include first and second fuse contact plugs having the same height as the first and second contact plugs, and a connection pattern having the same height as the third contact plug. The connection pattern may be connected between the first and second fuse contact plugs.

11 Claims, 23 Drawing Sheets

SEMICONDUCTOR DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2015-0127135, filed on Sep. 8, 2015, in the Korean Intellectual Property Office, the disclosure of which is hereby incorporated by reference in its entirety.

BACKGROUND

Embodiments of inventive concepts relate to a semiconductor device and a method of manufacturing the same. More particularly, embodiments of the inventive concepts relate to a semiconductor device including an electrical fuse and a method of manufacturing the same.

Semiconductor memory devices, which may be referred to herein as semiconductor chips, formed on a semiconductor substrate may be electrically tested before an assembly process. By testing before assembly, the semiconductor memory devices may be classified as bad (that is, failed) chips or good (that is, passed) chips before assembly. If a bad chip operates incorrectly due to a bad cell, a repair process may be performed to replace the bad cell with a redundant cell. Fuses may be blown or programed during the repair process to allow, in the case of a memory cell, the redundant cell to take the address of the bad cell in a write mode and a read mode. During the repair process, a voltage may be applied to both ends of the repaired fuse to sense the resistance of the fuse, thereby checking whether the fuse is blown or not. Such fuses may be a laser fuse, blown using laser, or an electrical fuse, blown by applying a voltage, for example.

SUMMARY

Example embodiments in accordance with principles of inventive concepts may provide a semiconductor device with improved fusing performance.

Example embodiments in accordance with principles of inventive concepts may provide a method of manufacturing the semiconductor device with improved fusing performance.

In an example embodiment in accordance with principles of inventive concepts, a semiconductor device may include a substrate including a first region and a second region, a transistor comprising a gate electrode and first and second dopant regions which are disposed on the substrate of the first region, first, second, and third contact plugs electrically connected to the first dopant region, the second dopant region, and the gate electrode, respectively, and a fuse structure disposed on the substrate of the second region. The fuse structure may include first and second fuse contact plugs having the same height as the first and second contact plugs, and a connection pattern having the same height as the third contact plug. The connection pattern may be connected between the first and second fuse contact plugs.

In example embodiments in accordance with principles of inventive concepts, top surfaces of the first and second contact plugs may be substantially coplanar with top surfaces of the first and second fuse contact plugs, and a top surface of the third contact plug may be substantially coplanar with a top surface of the connection pattern.

In example embodiments in accordance with principles of inventive concepts, the first and second contact plugs and the first and second fuse contact plugs may have a first weight, and the third contact plug and the connection pattern may have a second weight. The first height may be greater than the second height.

In example embodiments in accordance with principles of inventive concepts, the first and second contact plugs may include the same conductive material as the first and second fuse contact plugs, and the third contact plug may include the same conductive material as the connection pattern.

In example embodiments in accordance with principles of inventive concepts, the conductive material of the first and second contact plugs and the first and second fuse contact plugs may include tungsten, and the conductive material of the third contact plug and the connection pattern may include tungsten.

In example embodiments in accordance with principles of inventive concepts, widths of the first and second fuse contact plugs may be greater than a width of the connection pattern when viewed from a plan view.

In some embodiments, the semiconductor device may further include first interconnection vias disposed on the first fuse contact plug, second interconnection vias disposed on the second fuse contact plug, and interconnection lines electrically connected to the first and second interconnection vias.

In example embodiments in accordance with principles of inventive concepts, sizes of the first and second fuse contact plugs may be substantially equal to each other when viewed from a plan view. Sizes of the first and second interconnection vias may be substantially equal to each other when viewed from a plan view, and the number of the first interconnection vias may be equal to the number of the second interconnection vias.

In example embodiments in accordance with principles of inventive concepts, a size of the first fuse contact plug may be greater than that of the second fuse contact plug when viewed from a plan view, and the number of the first interconnection vias may be more than the number of the second interconnection vias.

In example embodiments in accordance with principles of inventive concepts, a size of the first fuse contact plug may be greater than that of the second fuse contact plug when viewed from a plan view, and sizes of the first interconnection vias may be greater than those of the second interconnection vias.

In example embodiments in accordance with principles of inventive concepts, the semiconductor device may further include interconnection vias electrically connected to the first to third contact plugs, respectively, and interconnection lines electrically connected to the interconnection vias.

In example embodiments in accordance with principles of inventive concepts, a method of manufacturing a semiconductor device may include preparing a substrate including a first region and a second region, forming a transistor including a gate electrode and first and second dopant regions on the substrate of the first region, forming first and second contact plugs electrically connected to the first and second dopant regions on the substrate of the first region, forming a third contact plug electrically connected to the gate electrode on the substrate of the first region, and forming a fuse structure on the substrate of the second region during the forming of the first, second, and third contact plugs.

In example embodiments in accordance with principles of inventive concepts, the fuse structure may include a first fuse contact plug, a second fuse contact plug, and a connection pattern connected between the first and second fuse contact plugs. The first and second fuse contact plugs may be formed during the forming of the first and second contact plugs, and the connection pattern may be formed during the forming of the third contact plug.

In example embodiments in accordance with principles of inventive concepts, the forming of the first to third contact plugs and the fuse structure may include forming an interlayer insulating layer on the substrate having the transistor, patterning the interlayer insulating layer to form first and second contact holes exposing the first and second dopant regions of the first region and to form first and second fuse contact holes exposing a top surface of the substrate of the second region, filling the first and second contact holes and the first and second fuse contact holes with a first conductive material to form the first and second contact plugs and the first and second fuse contact plugs, patterning the interlayer insulating layer to form a third contact hole exposing a top surface of the gate electrode of the first region and to form a recess region between the first and second fuse contact plugs of the second region, and filling the third contact hole and the recess region with a second conductive material to form the third contact plug and the connection pattern.

In example embodiments in accordance with principles of inventive concepts, each of the first and second conductive materials may include tungsten.

In example embodiments in accordance with principles of inventive concepts, the method may further include forming first interconnection vias disposed on the first fuse contact plug and second interconnection vias disposed on the second fuse contact plug, and forming interconnection lines connected to the first and second interconnection vias.

In example embodiments in accordance with principles of inventive concepts a method of manufacturing a semiconductor memory device includes preparing a substrate including a first region and a second region; forming a transistor including a gate electrode and first and second dopant regions on the substrate of the first region; forming first and second contact plugs electrically connected to the first and second dopant regions on the substrate of the first region; forming a third contact plug electrically connected to the gate electrode on the substrate of the first region; and forming a fuse structure on the substrate of the second region during the forming of the first, second, and third contact plugs, wherein the fuse structure is configured to be opened to reroute a connection to a memory cell.

In example embodiments in accordance with principles of inventive concepts a method of manufacturing a semiconductor memory device includes a fuse structure including a first fuse contact plug, a second fuse contact plug, and a connection pattern connected between the first and second fuse contact plugs, wherein the first and second fuse contact plugs are formed during the forming of the first and second contact plugs, and wherein the connection pattern is formed during the forming of the third contact plug, the connection pattern forms a path to a memory cell and the connection pattern is opened after testing determines that the memory cell has failed.

In example embodiments in accordance with principles of inventive concepts a method of manufacturing a semiconductor memory device includes the forming of the first to third contact plugs and the fuse structure including forming an interlayer insulating layer on the substrate having the transistor; patterning the interlayer insulating layer to form first and second contact holes exposing the first and second dopant regions of the first region and to form first and second fuse contact holes exposing a top surface of the substrate of the second region; filling the first and second contact holes and the first and second fuse contact holes with a first conductive material to form the first and second contact plugs and the first and second fuse contact plugs; patterning the interlayer insulating layer to form a third contact hole exposing a top surface of the gate electrode of the first region and to form a recess region between the first and second fuse contact plugs of the second region; and filling the third contact hole and the recess region with a second conductive material to form the third contact plug and the connection pattern.

In example embodiments in accordance with principles of inventive concepts a method of manufacturing a semiconductor memory device includes each of the first and second conductive materials including tungsten.

In example embodiments in accordance with principles of inventive concepts a method of manufacturing a semiconductor memory device includes forming first interconnection vias disposed on the first fuse contact plug and second interconnection vias disposed on the second fuse contact plug; and forming interconnection lines connected to the first and second interconnection vias.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
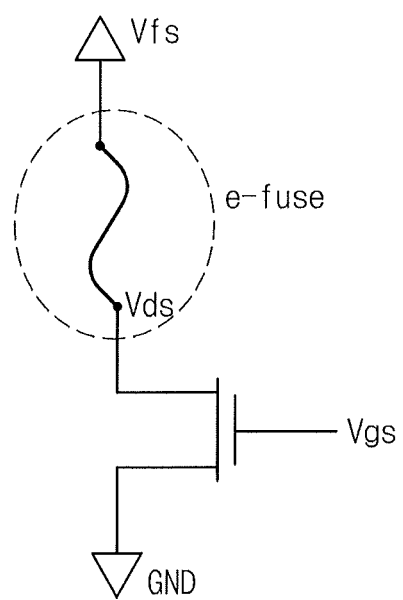
FIG. 1 is a circuit diagram illustrating a fuse driving circuit according to some embodiments of the inventive concepts.

Inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

It will be understood that when an element such as a layer, region or substrate is referred to as being "on" another element, it can be directly on the other element or intervening elements may be present. In contrast, the term "directly on" means that there are no intervening elements. As used herein, the term "and/or" includes any and all combinations of one or more of the associated listed items.

Moreover, example embodiments are described herein with reference to cross-sectional views and/or plan views that are idealized exemplary views. In the drawings, the thicknesses of layers and regions may be exaggerated for clarity. Accordingly, variations from the shapes of the illustrations as a result, for example, of manufacturing techniques and/or tolerances, are to be expected. As a result, example embodiments should not be construed as limited to the shapes of regions illustrated herein but are to include deviations in shapes that result, for example, from manufacturing. For example, an etching region illustrated as a rectangle will, typically, have rounded or curved features. As a result, the regions illustrated in the figures are schematic in nature and their shapes are not intended to illustrate the actual shape of a region of a device and are not intended to limit the scope of example embodiments. It will be also understood that although the terms first, second, third etc. may be used herein to describe various elements, these elements should not be limited by these terms. These terms are only used to distinguish one element from another element. As a result, a first element in some embodiments could be termed a second element in other embodiments without departing from the teachings of the present inventive concepts. Example embodiments of aspects of the present inventive concepts explained and illustrated herein include their complementary counterparts.

The terminology used herein is for the purpose of describing particular embodiments only and is not intended to limit the inventive concepts. As used herein, the singular terms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Hereinafter, example embodiments of the inventive concepts will be described in detail with reference to the drawings.

In example embodiments in accordance with principles of inventive concepts, a fuse structure may be formed at the same time contact plugs for a transistor are formed. The fuse structure may then be used to reroute connections to a memory cell, by opening a path, for example, after the memory cells has been tested. In example embodiments, a good memory cell may be substituted for a bad, or failed, memory cell using a fuse structure formed in this manner.

FIG. 1 is a circuit diagram illustrating a fuse driving circuit according to some example embodiments in accordance with principles of the inventive concepts.

Referring to FIG. 1, a fuse driving circuit may include an electrical fuse (e-fuse).

The e-fuse may include a first end and a second end. The first end of the e-fuse may be electrically connected to a transistor, and a predetermined voltage may be applied to the second end of the e-fuse. A gate voltage Vgs may be applied to a gate of the transistor, and a ground voltage GND may be provided to one end of the transistor.

When the gate voltage Vgs is applied to the gate of the transistor and a predetermined voltage Vfs may be applied to the second end of the e-fuse, the e-fuse may be blown to increase a resistance value between the both ends of the e-fuse. In other word, the e-fuse may be physically broken, or "blown."

In order to ensure that the fuse has been blown, a predetermined voltage may be applied between the both ends of the e-fuse to sense the resistance value, thereby checking whether the e-fuse is blown or not, with an extremely high resistance indicating that the fuse has been blown.

Figure 2A:
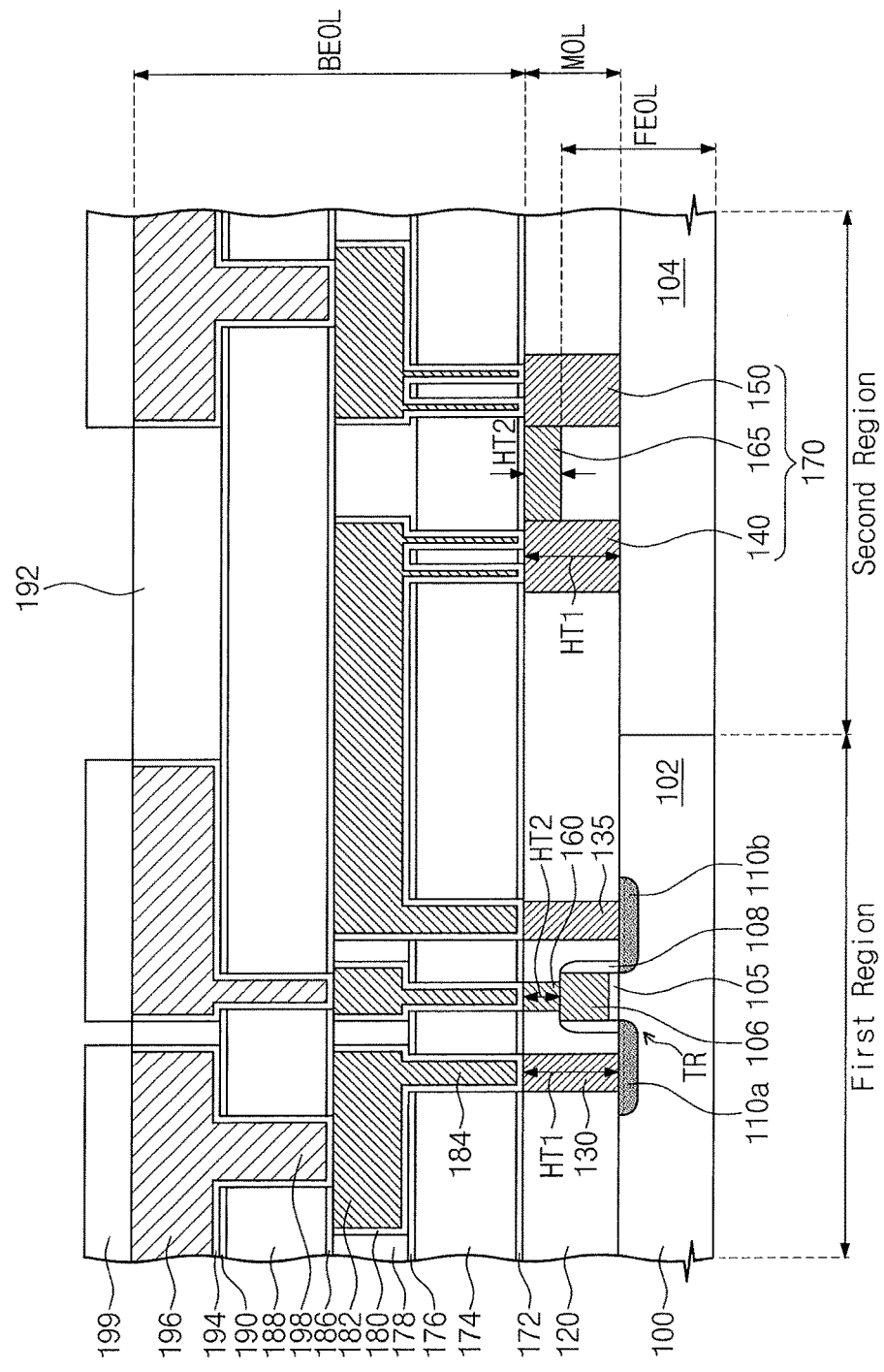
FIGS. 2A, 3A, and 4A are cross-sectional views illustrating semiconductor devices according to some embodiments of the inventive concepts.
Figure 2B:
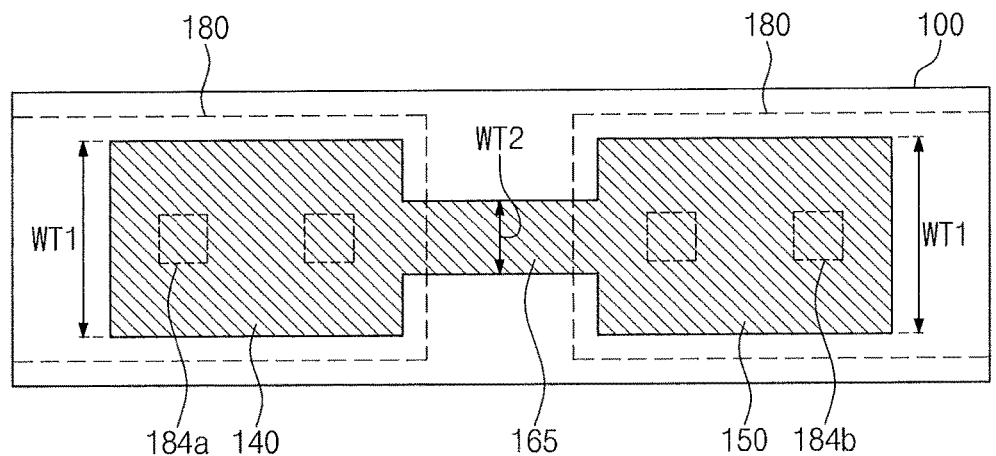
FIGS. 2B through 2G are plan views illustrating embodiments of a fuse structure of the semiconductor device of FIG. 2A.
Figure 2C:
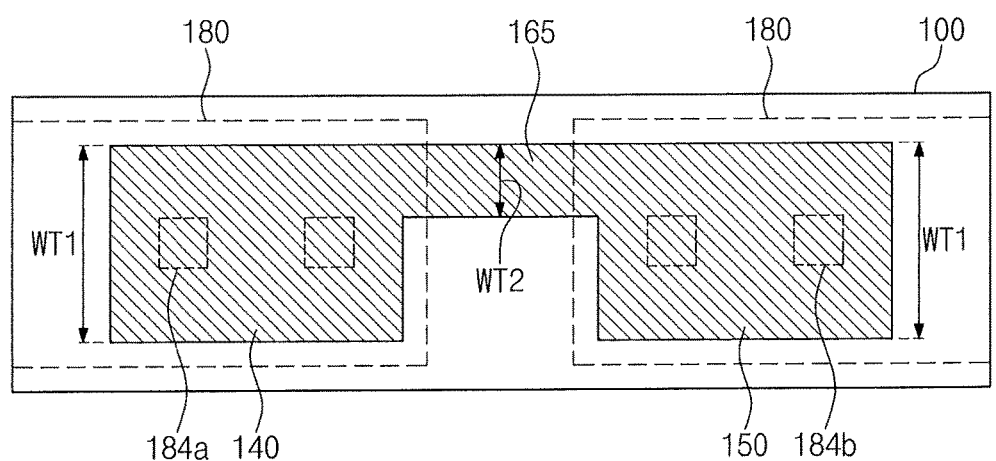
Figure 2D:
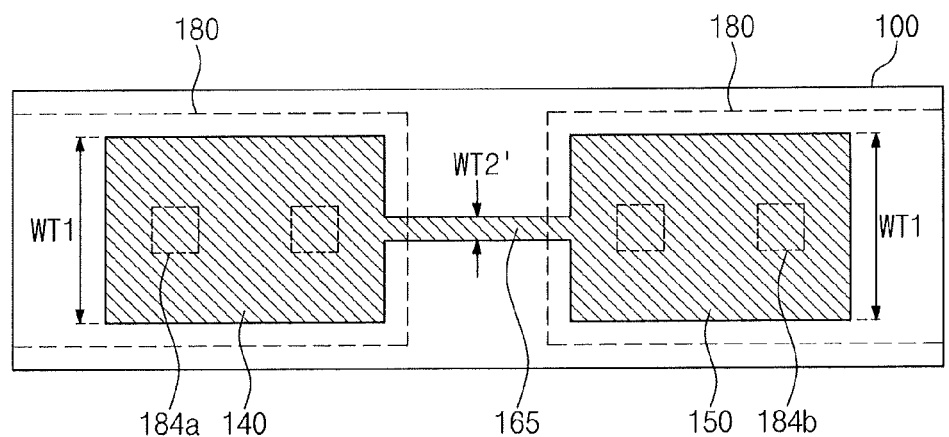
Figure 2E:
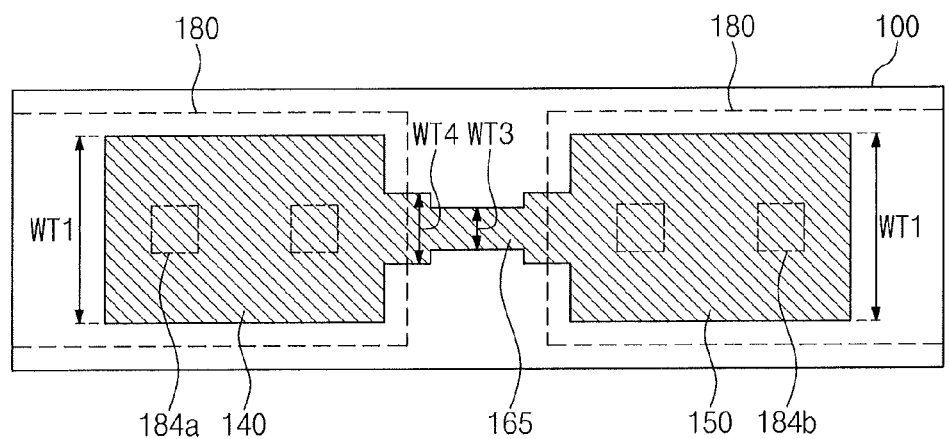
Figure 2F:
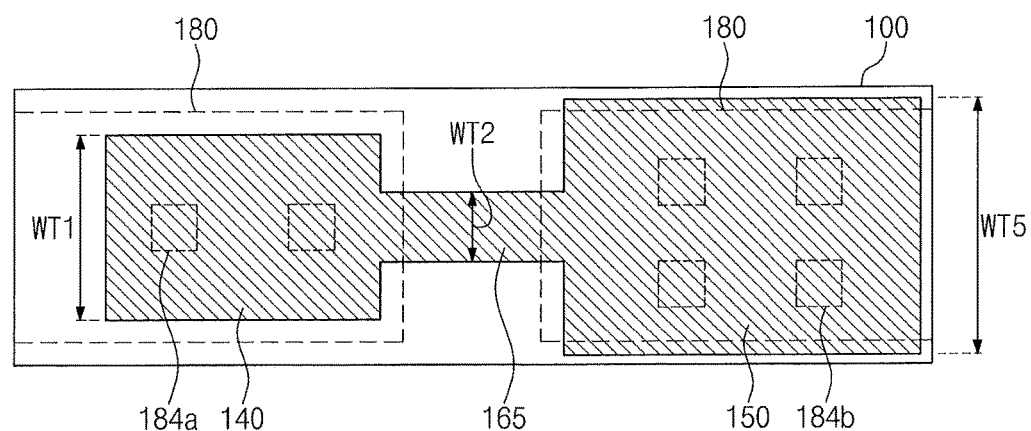
Figure 2G:
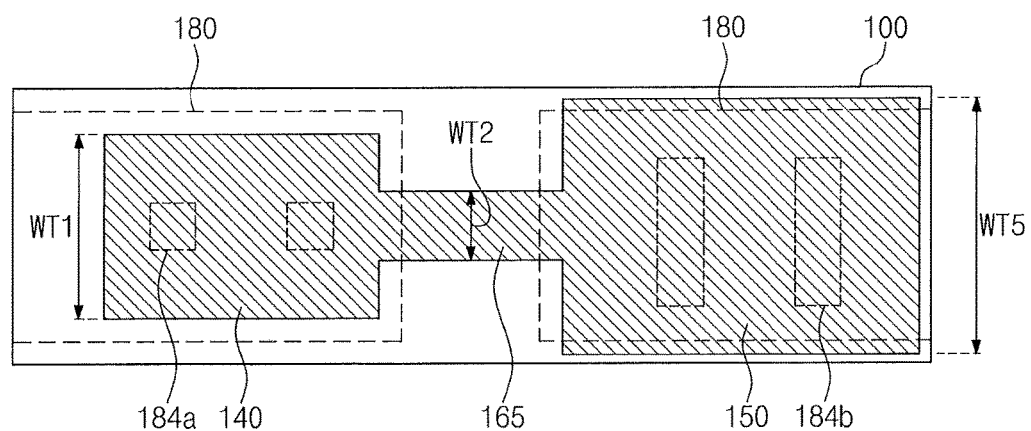
Figure 3A:
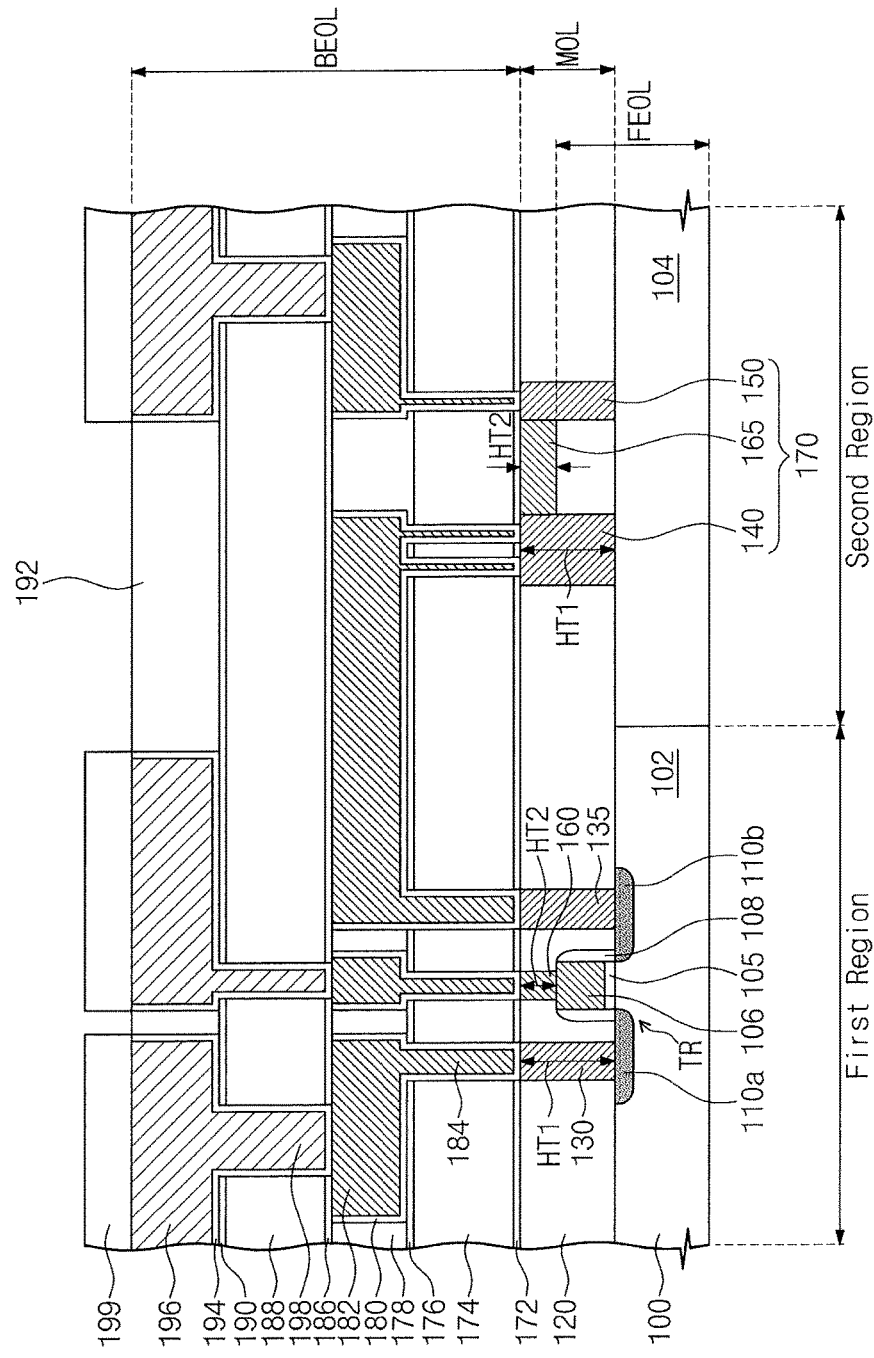
Figure 3B:
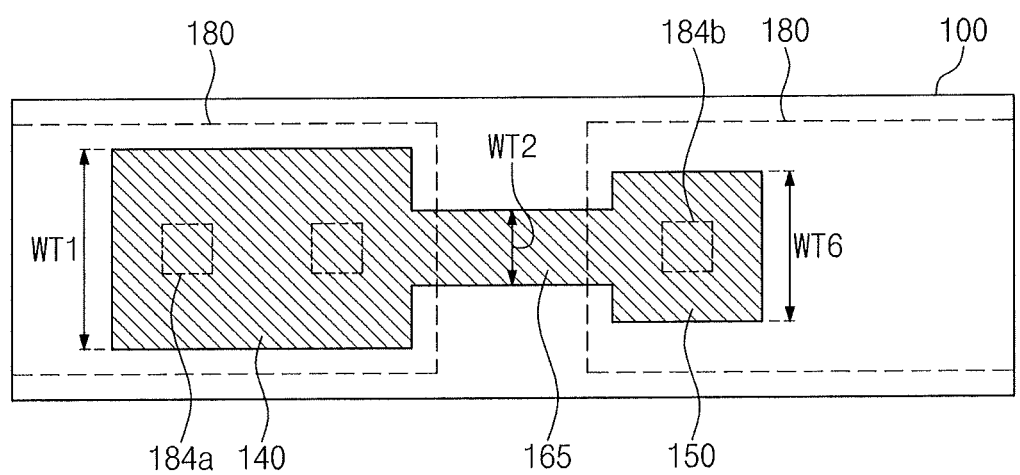
FIGS. 3B and 4B are plan views illustrating fuse structures of the semiconductor devices of FIGS. 3A and 4A, respectively.
Figure 4A:
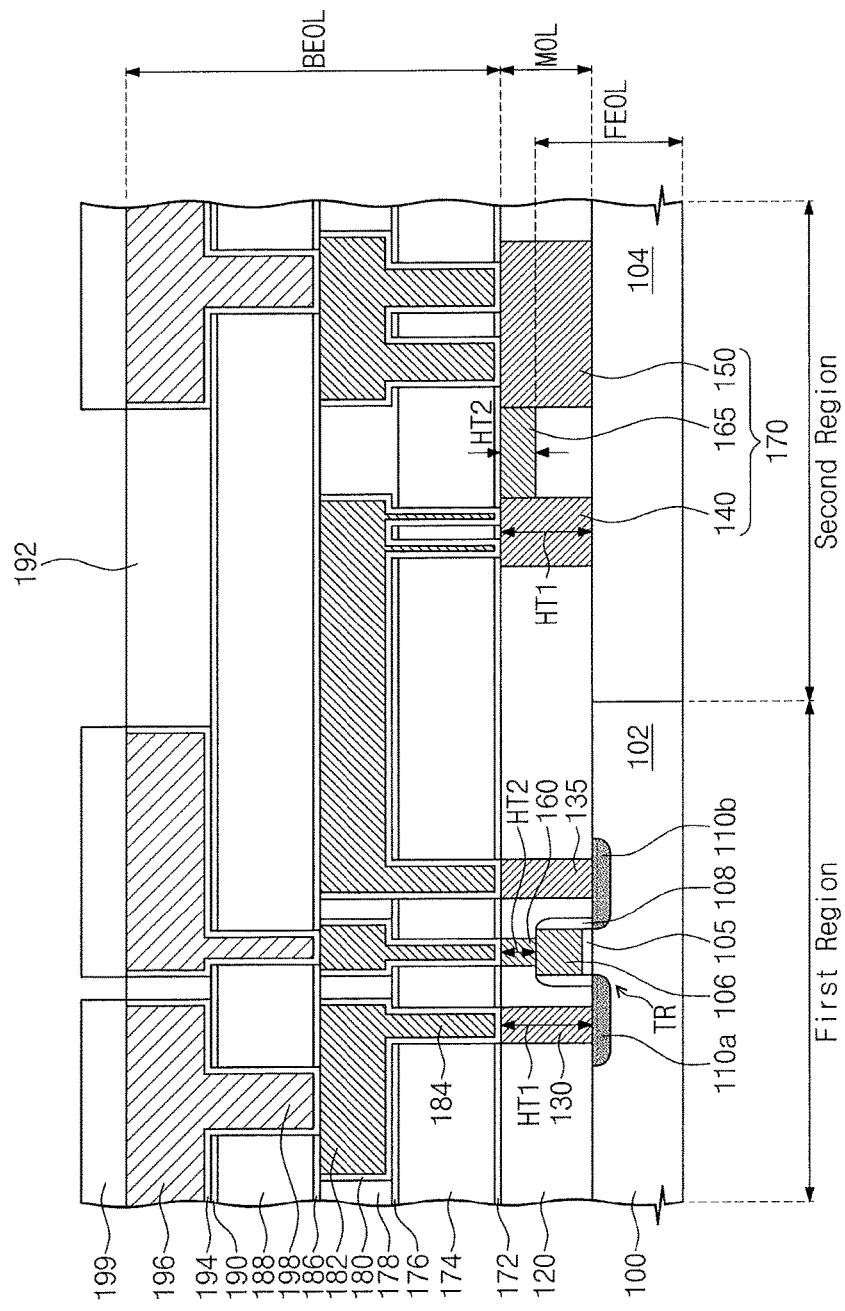
Figure 4B:
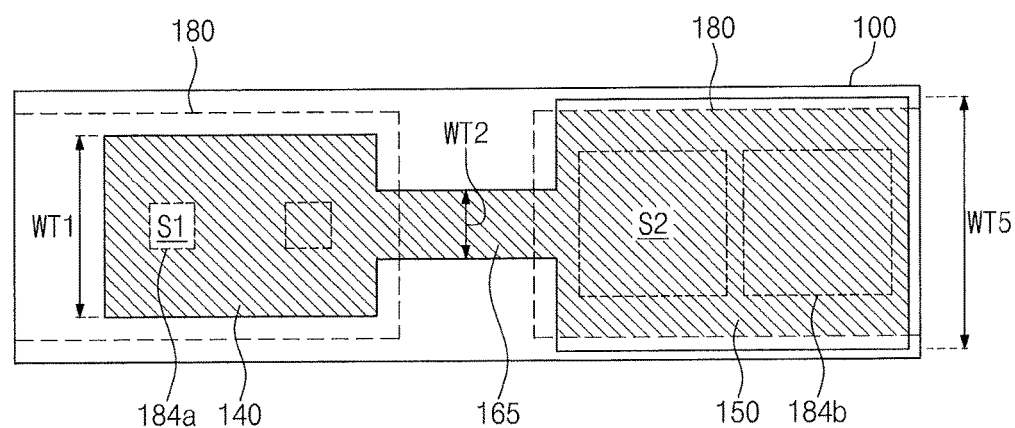

FIGS. 2A, 3A, and 4A are cross-sectional views illustrating semiconductor devices according to some example embodiments of the inventive concepts. FIGS. 2B through 2G are plan views illustrating embodiments of a fuse structure of the semiconductor device of FIG. 2A. FIGS. 3B and 4B are plan views illustrating fuse structures of the semiconductor devices of FIGS. 3A and 4A, respectively.

Referring to FIGS. 2A, 3A, and 4A, a semiconductor device may include a transistor TR and a fuse structure 170 disposed on a substrate 100.

The substrate 100 may be a semiconductor substrate including silicon, germanium, or silicon-germanium or may be a silicon-on-insulator (SOI) substrate or a germanium-on-insulator (GOI) substrate, for example.

The substrate 100 may include a device isolation layer 104 defining an active region 102. The device isolation layer 104 may include an insulating material such as silicon oxide, silicon nitride, and/or silicon oxynitride, for example.

In some example embodiments, the substrate 100 may include a first region in which the transistor TR is disposed, and a second region in which the fuse structure 170 is disposed.

The transistor TR of the first region may be electrically connected to the fuse structure 170 to switch the fuse structure 170. Even though not shown in detail in the drawings, the first region may correspond to a memory cell region and the transistor TR may function as a portion of a memory component electrically connected to a data storage element such as a capacitor.

The transistor TR corresponding to a planar transistor is illustrated as an example in FIGS. 2A, 3A, and 4A.

In some example embodiments, processes of manufacturing the semiconductor device may be classified into front-end-of-line (FEOL) processes, middle-of-line (MOL) processes, and back-end-of-line (BEOL) processes. The FEOL processes may include a process of preparing the substrate 100, a process of forming the device isolation layer 104 in the substrate 100, and a process of forming the transistor TR, for example. The transistor TR may include a gate insulating layer 105, a gate electrode 106, first and second dopant regions 110a and 110b, and a spacer. The MOL processes may include a process of forming first and second contact plugs 130 and 135 electrically connected to the first and second dopant regions 110a and 110b of the transistor TR, respectively, and a process of forming a third contact plug 160 electrically connected to the gate electrode 106 of the transistor TR, for example. The BEOL processes may include processes of forming an interconnection structure 180, 182, 184, 194, 196, and 198, a process of forming a through-silicon via (TSV, not shown), a bumping process (not shown), and a redistribution process (not shown), for example.

While the FEOL, MOL, and BEOL processes are sequentially performed on the substrate 100 of the first region, the fuse structure 170 may be formed on the substrate 100 of the second region. According to some embodiments of the inventive concepts, the fuse structure 170 may be formed during the MOL processes.

A fuse structure may be generally formed during the BEOL processes. However, the fuse structure 170 according to some embodiments of the inventive concepts may be formed during the MOL processes, and, as a result, verification of operation of the semiconductor device may be performed in an earlier process. As described above, the BEOL processes may include the processes of the interconnection structure 180, 182, 184, 194, 196, and 198. However, the processes of the interconnection structure 180, 182, 184, 194, 196, and 198 may be variously changed depending on a kind of the semiconductor device. In example embodiments, a process change of the MOL processes may be relatively small, and, as a result, the fuse structure 170 may be effectively formed during the MOL processes.

The transistor TR, the first to third contact plugs 130, 135, and 160, and the interconnection structure 180, 182, 184, 194, 196, and 198 will be described in greater detail hereinafter.

According to example embodiments illustrated in FIGS. 2A, 3A, and 4A, the first and second contact plugs 130 and 135 may be disposed in the first region and may be electrically connected to the first and second dopant regions 110a and 110b of the transistor TR, respectively. The first contact plug 130 may have a first height HT1. The second contact plug 135 may have the substantially same height (that is, the first height HT1) as the first contact plug 130. Top surfaces of the first and second contact plugs 130 and 135 may be substantially coplanar with each other. The third contact plug 160 may be disposed in the first region so as to be electrically connected to the gate electrode 106 of the transistor TR. The third contact plug 160 may have a second height HT2 lower than the first height HT1, and a top surface of the third contact plug 160 may be substantially coplanar with the top surfaces of the first and second contact plugs 130 and 135.

The fuse structure 170 may include a first fuse contact plug 140, a second fuse contact plug 150, and a connection pattern 165. The first fuse contact plug 140 may have substantially the same height (that is, the first height HT1) as the first contact plug 130, and the second fuse contact plug 150 may also have substantially the same height (that is, the first height HT1) as the first contact plug 130. Top surfaces of the first and second fuse contact plugs 140 and 150 may be substantially coplanar with each other and may be substantially coplanar with the top surfaces of the first and second contact plugs 130 and 135. The connection pattern 165 may have the substantially same height (that is, the second height HT2) as the third contact plug 160, and a top surface of the connection pattern 165 may be substantially coplanar with the top surface of the third contact plug 160.

In some example embodiments, the first and second fuse contact plugs 140 and 150 may be formed during formation of the first and second contact plugs 130 and 135. As a result, the heights HT1 of the first and second fuse contact plugs 140 and 150 may be substantially equal to the heights HT1 of the first and second contact plugs 130 and 135, as described above. In addition, the first and second fuse contact plugs 140 and 150 may include the same material as the first and second contact plugs 130 and 135. In some example embodiments, the first and second fuse contact plugs 140 and 150 and the first and second contact plugs 130 and 135 may include doped poly-silicon and/or a metal (for example, tungsten).

The connection pattern 165 may be formed during formation of the third contact plug 160. As a result, the height HT2 of the connection pattern 165 may be substantially equal to the height HT2 of the third contact plug 160, as described above. In addition, the connection pattern 165 may include the same material as the third contact plug 160. In some embodiments, the connection pattern 165 and the third contact plug 160 may include doped poly-silicon and/or a metal (for example, tungsten).

The interconnection structure 180, 182, 184, 194, 196, and 198 may be electrically connected to the first and second contact plugs 130 and 135 and the first and second fuse contact plugs 140 and 150. In some example embodiments, the interconnection structure 180, 182, 184, 194, 196, and 198 may include a first interconnection structure 180, 182, and 184 and a second interconnection structure 194, 196, and 198. The first interconnection structure 180, 182, and 184 may be electrically connected to the first and second contact plugs 130 and 135 and the first and second fuse contact plugs 140 and 150, and the second interconnection structure 194, 196, and 198 may be electrically connected to the first interconnection structure 180, 182, and 184. The first interconnection structure 180, 182, and 184 may include first interconnection vias 184 connected to the contact plugs 130, 135, 140 and 150 and first interconnection lines 182 connected to the first interconnection vias 184. The first interconnection via 184 and the first interconnection line 182 connected to each other may constitute one body. The first interconnection lines 182 and the first interconnection vias 184 may include a metal such as copper, tungsten, or aluminum. In addition, the first interconnection structure 180, 182, and 184 may further include a first metal barrier layer 180 surrounding outer surfaces of the first interconnection line 182 and the first interconnection via 184. The first metal barrier layer 180 may include titanium and/or tantalum nitride, for example.

The second interconnection structure 194, 196, and 198 may include second interconnection vias 198 electrically connected to the first interconnection lines 182, and second interconnection lines 196 connected to the second interconnection vias 198. The second interconnection via 198 and the second interconnection line 196 connected to each other may constitute one body. The second interconnection vias 198 and the second interconnection lines 196 may include a metal such as copper, tungsten, or aluminum, for example. In addition, the second interconnection structure 194, 196, and 198 may further include a second metal barrier layer 194 surrounding outer surfaces of the second interconnection line 196 and the second interconnection via 198. The second metal barrier layer 194 may include titanium and/or tantalum nitride.

Capping patterns 199 for protecting the second interconnection structure 194, 196, and 198 may be disposed on the second interconnection structure 194, 196, and 198. In some embodiments, the capping patterns 199 may include at least one of silicon nitride, silicon oxide, or silicon oxynitride.

In the present embodiments, the interconnection structure including the interconnection lines 182 and 196 constituting a double-layered structure is described as an example. However, embodiments of the inventive concepts are not limited to the number of layers of the interconnection lines included in the interconnection structure.

A planar shape of the fuse structure 170 and relation between the first interconnection vias 184 and the fuse contact plugs 140 and 150 will be described in greater detail hereinafter. For the purpose of ease and convenience in explanation, the first interconnection vias disposed on the first fuse contact plug 140 will be indicated by a reference designator '184a' and the first interconnection vias disposed on the second fuse contact plug 150 will be indicated by a reference designator '184b'.

Referring to FIGS. 2B through 2E, a size (for example, an area) and a structure of the first fuse contact plug 140 may be the substantially same as a size and a structure of the second fuse contact plug 150, respectively. For example, the first and second fuse contact plugs 140 and 150 may have the substantially same width, that is, a first width WT1. A width of the connection pattern 165 may be smaller than those of the first and second fuse contact plugs 140 and 150. For example, the connection pattern 165 may have a second width WT2.

When an operation of blowing the fuse structure 170 is performed, the connection pattern 165 having the relatively small width may be blown. The blowing operation of the fuse structure 170 may be more easily performed as a difference between the first and second widths WT1 and WT2 increases, as the number of the first connection vias 184a and 184b connected to the fuse contact plugs 140 and 150 increases, as sizes (for example, areas) of the fuse contact plugs 140 and 150 increase, and/or as sizes of the first connection vias 184a and 184b increase.

In the embodiments of FIGS. 2B, 2D, and 2E, the connection pattern 165 may be connected between central portions of the first and second fuse contact plugs 140 and 150. In the embodiment of FIG. 2C, the connection pattern 165 may be connected between edge portions of the first and second fuse contact plugs 140 and 150.

A width WT2' of the connection pattern 165 illustrated in FIG. 2D may be smaller than the width WT2 of the connection pattern 165 illustrated in FIG. 2B or 2C. As a result, the connection pattern 165 of FIG. 2D may be more easily blown in a blowing operation. In FIG. 2E, a width WT3 of a central portion of the connection pattern 165 may be smaller than widths WT4 of edge portions, connected to the fuse contact plugs 140 and 150, of the connection pattern 165.

Referring to FIGS. 2F and 2G, a size and a structure of the first fuse contact plug 140 may be different from a size and a structure of the second fuse contact plug 150. In some embodiments, the second fuse contact plug 150 may be greater than the first fuse contact plug 140. For example, a width WT5 of the second fuse contact plug 150 may be greater than the width WT1 of the first fuse contact plug 140.

Referring to FIG. 2F, a size (for example, an area) of the second fuse contact plug 150 may be greater than that of the first fuse contact plug 140, and the number of the first interconnections vias 184b connected to the second fuse contact plug 150 may be more than the number of the first interconnections vias 184a connected to the first fuse contact plug 140. The first interconnection vias 184a and 184b may have the same size and the same structure. Two first interconnection vias 184a may be disposed on the first fuse contact plug 140, and four first interconnection vias 184b may be disposed on the second fuse contact plug 150. In the present example embodiment, the two interconnection vias 184a on the first fuse contact plug and the four interconnection vias 184b on the second fuse contact plug are described as an example. However, embodiments of inventive concepts are not limited thereto.

Referring to FIG. 2G, a size (for example, an area) of the first interconnection via 184b connected to the second fuse contact plug 150 may be greater than a size (for example, an area) of the first interconnection via 184a connected to the first fuse contact plug 140. Each of the first interconnection vias 184a on the first fuse contact plug 140 may have a first size, and each of the first interconnection vias 184b on the second fuse contact plug 150 may have a second size greater than the first size. In the present example embodiment, two interconnection vias 184a or 184b disposed on each of the first and second fuse contact plugs 140 and 150 are illustrated as an example. However, embodiments of inventive concepts are not limited thereto.

Referring to FIGS. 3A and 3B, the width WT1 of the first fuse contact plug 140 may be greater than a width WT6 of the second fuse contact plug 150. The first interconnection vias 184a and 184b may have the same size and the same structure. Two first interconnection vias 184a may be disposed on the first fuse contact plug 140, and one first interconnection via 184b may be disposed on the second fuse contact plug 150. In the present example embodiment, the two interconnection vias 184a on the first fuse contact plug 140 and the one interconnection via 184b on the second fuse contact plug 150 are illustrated as an example. However, embodiments of the inventive concepts are not limited thereto.

Referring to FIGS. 4A and 4B, the width WT5 of the second fuse contact plug 150 may be greater than the width WT1 of the first fuse contact plug 140. Two first interconnection vias 184a having a first size S1 (for example, a first area) may be disposed on the first fuse contact plug 140, and two first interconnection vias 184b having a second size S2 (for example, a second area) may be disposed on the second fuse contact plug 150. The second size S2 may be greater than the first size S1. In the present example embodiment, the two interconnection vias 184a or 184b disposed on each of the first and second fuse contact plugs 140 and 150 are illustrated as an example. However, embodiments of inventive concepts are not limited thereto.

Embodiments of the inventive concepts are not limited to the planar shapes of the first and second fuse contact plugs 140 and 150 and the structures and the numbers of the first interconnection vias 184a and 184b, which are described with reference to FIGS. 2B through 2G, 3A, 3B, 4A, and 4B.

FIGS. 5 through 15 are cross-sectional views illustrating a method of manufacturing a semiconductor device, according to example embodiments in accordance with principles of inventive concepts.

Figure 5:
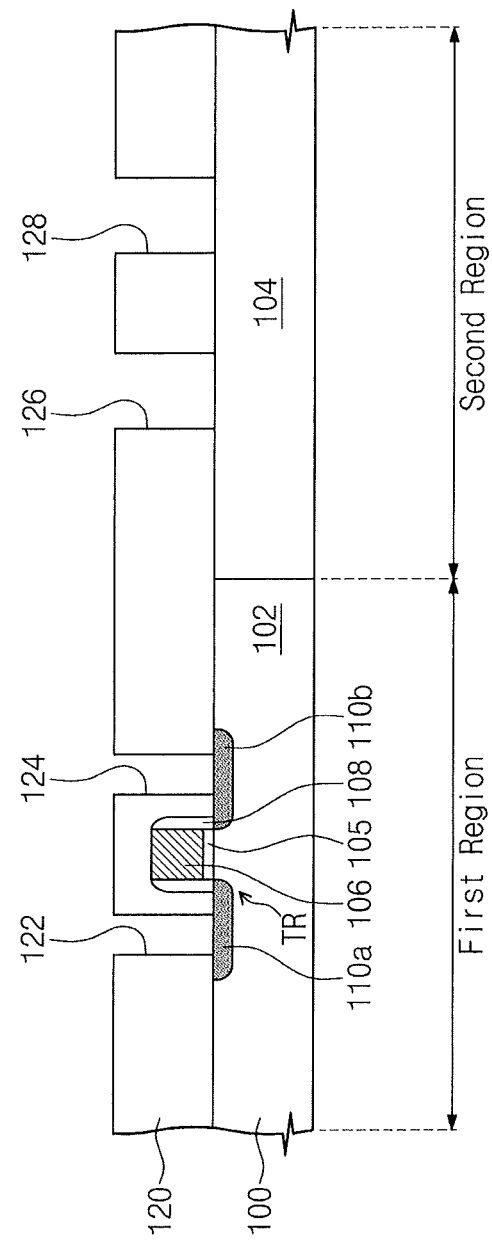
FIGS. 5 through 15 are cross-sectional views illustrating a method of manufacturing a semiconductor device, according to some embodiments of the inventive concepts.

Referring to FIG. 5, a substrate 100 including first and second regions may be prepared. A transistor TR may be formed on the substrate 100 of the first region.

In some embodiments, a device isolation layer 104 may be formed in the substrate 100 to define an active region 102. The device isolation layer 104 may include an insulating material such as silicon oxide, silicon nitride, and/or silicon oxynitride, for example.

A gate insulating layer 105 may be formed on the substrate 100 of the first region, and a gate electrode 106 may be formed on the gate insulating layer 105. The gate insulating layer 105 may include silicon oxide and/or an insulating metal oxide. The gate electrode 106 may include doped poly-silicon and/or a metal (for example, tungsten or copper). Spacers 108 may be formed on sidewalls of the gate electrode 106. The spacers 108 may include silicon nitride. Dopants may be injected into the active region 102 to form first and second dopant regions 110a and 110b at both sides of the gate electrode 106. The dopants may be injected using the gate electrode 106 and the spacers 108 as an ion implantation mask.

A first interlayer insulating layer 102 may be formed on an entire top surface of the substrate 100. The first interlayer insulating layer 120 may include at least one of silicon oxide, silicon nitride, or silicon oxynitride.

The first interlayer insulating layer 120 may be patterned to form first and second contact holes 122 and 124 and first and second fuse contact holes 126 and 128. The first and second contact holes 122 and 124 may be formed in the first region of the substrate 100 to expose the first and second dopant regions 110a and 110b, respectively. The first and second fuse contact holes 126 and 128 may be formed in the second region of the substrate 100 to expose portions of the device isolation layer 104, respectively. The first and second fuse contact holes 126 and 128 may be spaced apart from each other.

Figure 6:
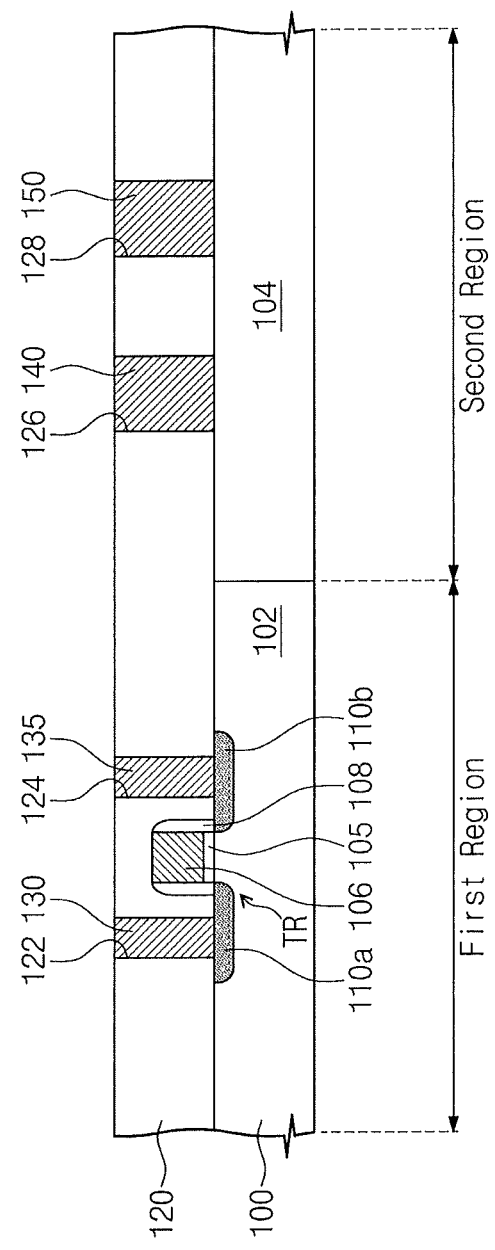

Referring to FIG. 6, a first contact plug 130, a second contact plug 135, a first fuse contact plug 140, and a second fuse contact plug 150 may be formed in the first contact hole 122, the second contact hole 124, the first fuse contact hole 126, and the second fuse contact hole 128, respectively. The first and second contact plugs 130 and 135 and the first and second fuse contact plugs 140 and 150 may be formed by filling the first and second contact holes 122 and 124 and the first and second fuse contact holes 126 and 128 with a conductive material. In example embodiments, the conductive material may include at least one of doped poly-silicon or a metal (for example, tungsten), for example.

Figure 7:
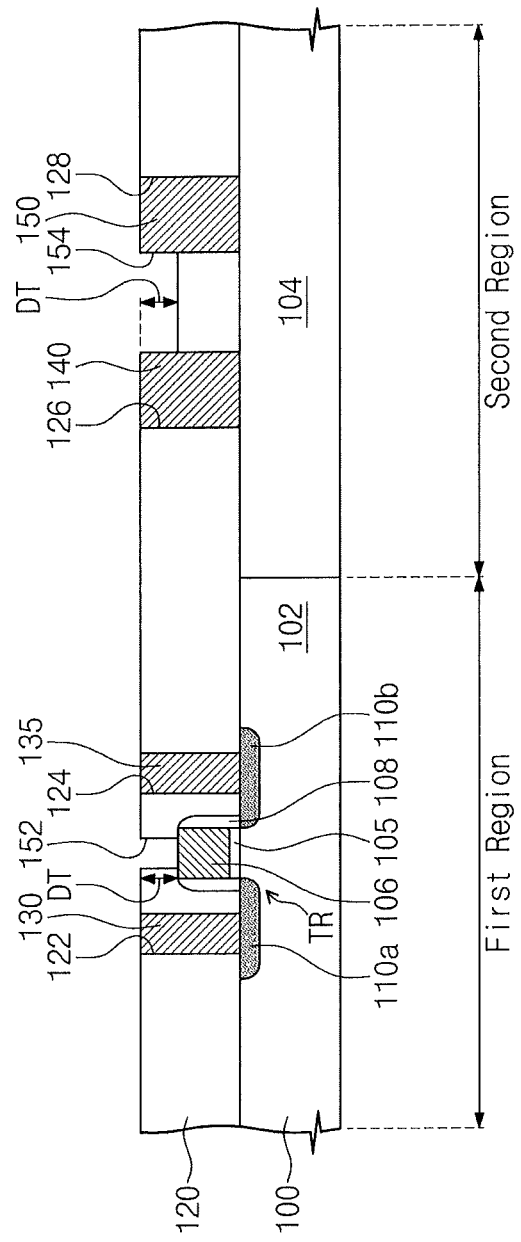

Referring to FIG. 7, a mask pattern (not shown) may be formed on the first interlayer insulating layer 120, and the first interlayer insulating layer 120 may be etched using the mask pattern as an etch mask to form a third contact hole 152 and a recess region 154. The third contact hole 152 may expose the gate electrode 106 formed in the first region of the substrate 100, and a recess region 154 may be formed between the first and second fuse contact plugs 140 and 150 formed in the second region of the substrate 100.

The third contact hole 152 and the recess region 154 may be formed by the same process, and, as a result, a depth DT of the third contact hole 152 may be substantially equal to a depth DT of the recess region 154.

The mask pattern may be removed after the formation of the third contact hole 152 and the recess region 154.

Figure 8:
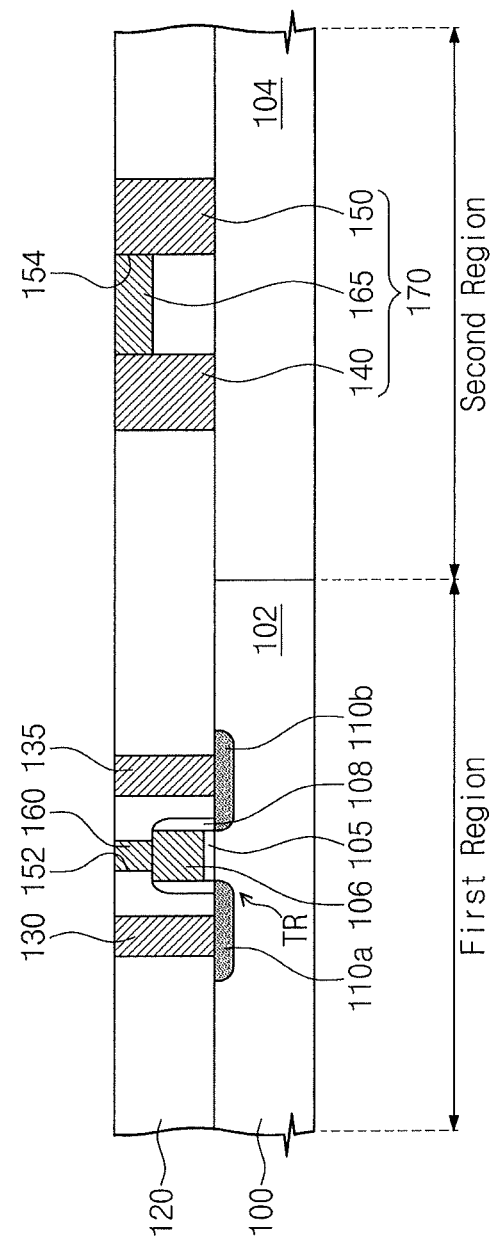

Referring to FIG. 8, a third contact plug 160 and a connection pattern 165 may be formed in the third contact hole 152 and the recess region 154, respectively. The third contact plug 160 and the connection pattern 165 may be formed by filling the third contact hole 152 and the recess region 154 with a conductive material. The conductive material may include at least one of doped poly-silicon or a metal (for example, tungsten).

In this manner, a fuse structure 170 including the first and second fuse contact plugs 140 and 150 and the connection pattern 165 may be formed in the second region.

Figure 9:
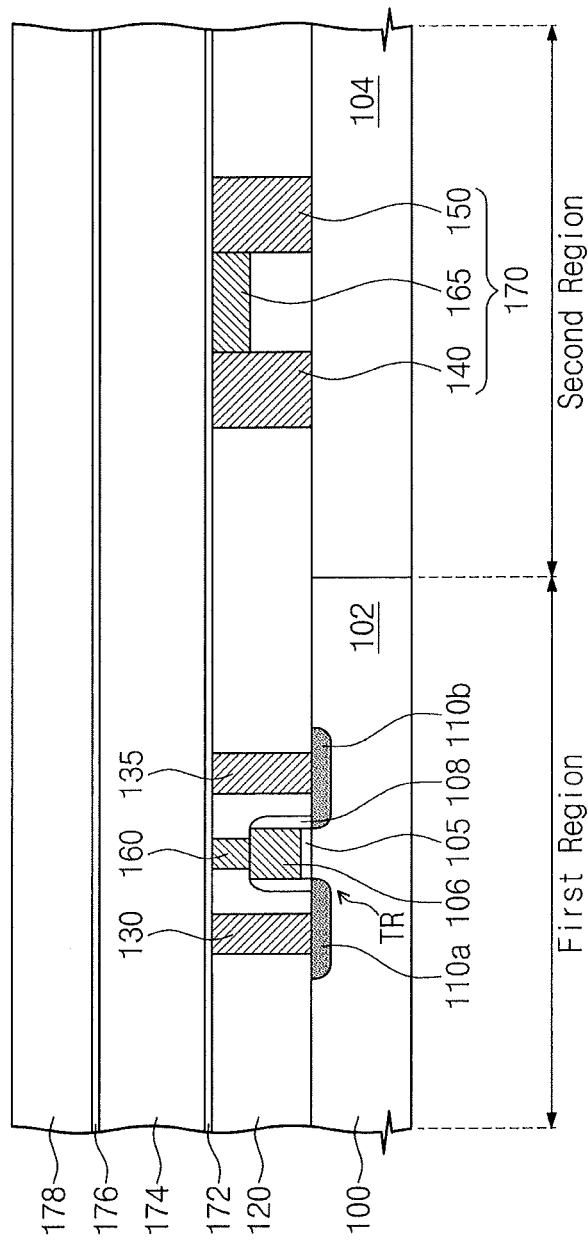

Referring to FIG. 9, a first etch stop layer 172, a second interlayer insulating layer 174, a second etch stop layer 176, and a third interlayer insulating layer 178 may be sequentially formed on the first interlayer insulating layer 120. The first and second etch stop layers 172 and 176 may include a material having an etch selectivity with respect to the second and third interlayer insulating layers 174 and 178. For example, the second and third interlayer insulating layers 174 and 178 may include silicon oxide, and the first and second etch stop layers 172 and 176 may include silicon nitride.

Figure 10:
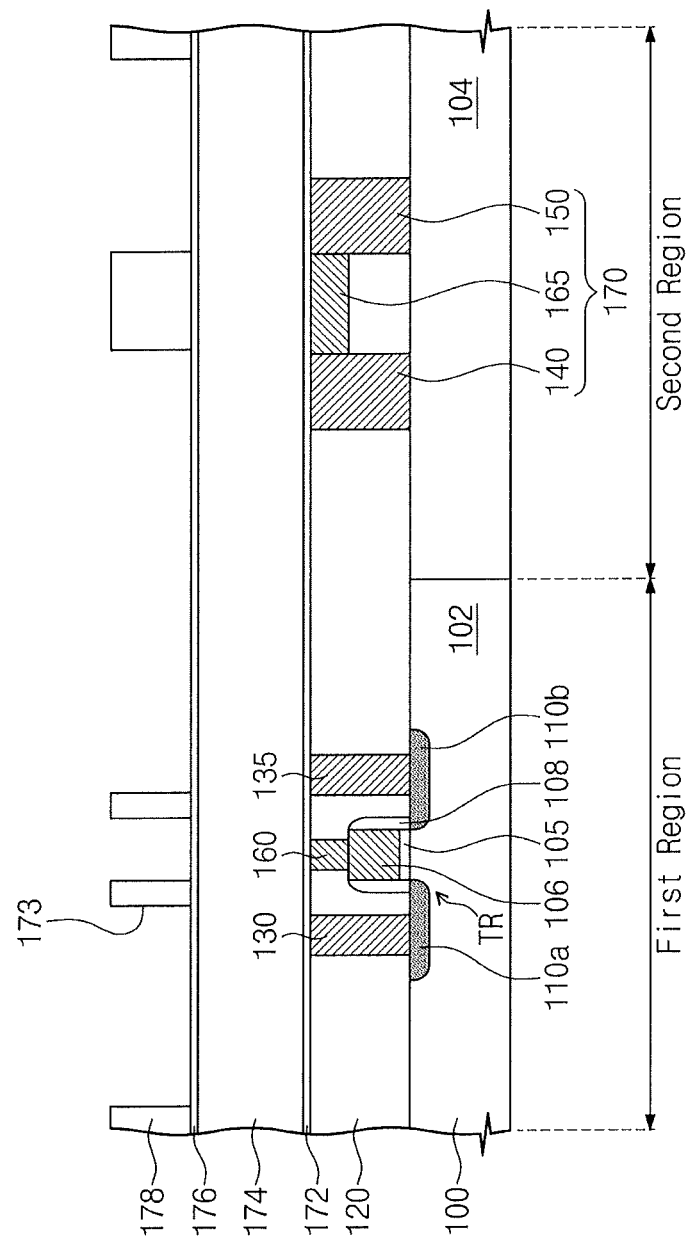

Referring to FIG. 10, the third interlayer insulating layer 178 may be patterned to form first openings 173 exposing the second etch stop layer 176. In the patterning process, the second etch stop layer 176 may stop an etching process of etching the third interlayer insulating layer 178 such that the second interlayer insulating layer 174 is not etched.

Figure 11:
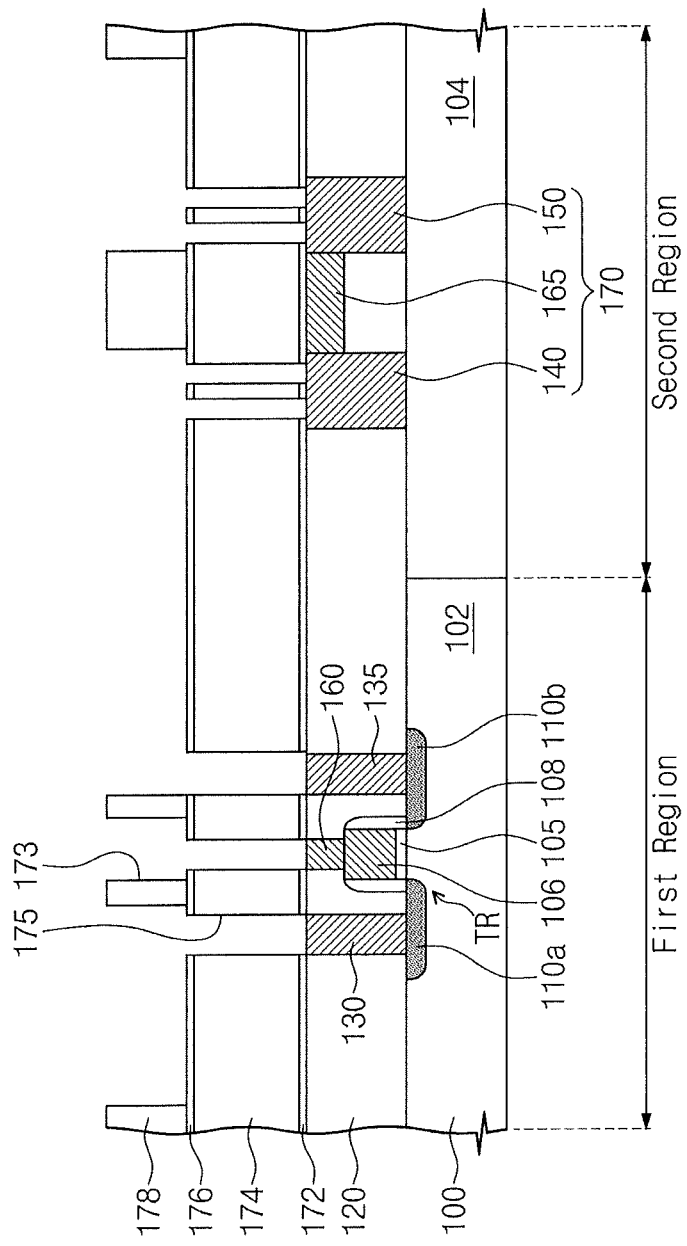

Referring to FIG. 11, the second etch stop layer 176, the second interlayer insulating layer 174, and the first etch stop layer 172, which are disposed under the first openings 173, may be patterned to form first via holes 175 that are connected to the first openings 173 and to expose top surfaces of the first and second contact plugs 130 and 135 and top surfaces of the first and second fuse contact plugs 140 and 150. Although not shown in detail in the drawings, a mask pattern formed on the third interlayer insulating layer 178 having the first openings 173, and then, the second etch stop layer 176, the second interlayer insulating layer 174, and the first etch stop layer 172 may be etched using the mask pattern as an etch mask to form the first via holes 175.

According to some example embodiments, the first etch stop layer 172 may stop an etch process of etching the second interlayer insulating layer 174 so that the first and second contact plugs 130 and 135 and the first and second fuse contact plugs 140 and 150 are not etched. After the etching process of the second interlayer insulating layer 174 is completed, the etching process may be controlled to etch the first etch stop layer 172. In this manner, the first via holes 174 may be formed to expose the top surfaces of the first and second contact plugs 130 and 135 and the top surfaces of the first and second fuse contact plugs 140 and 150.

Figure 12:
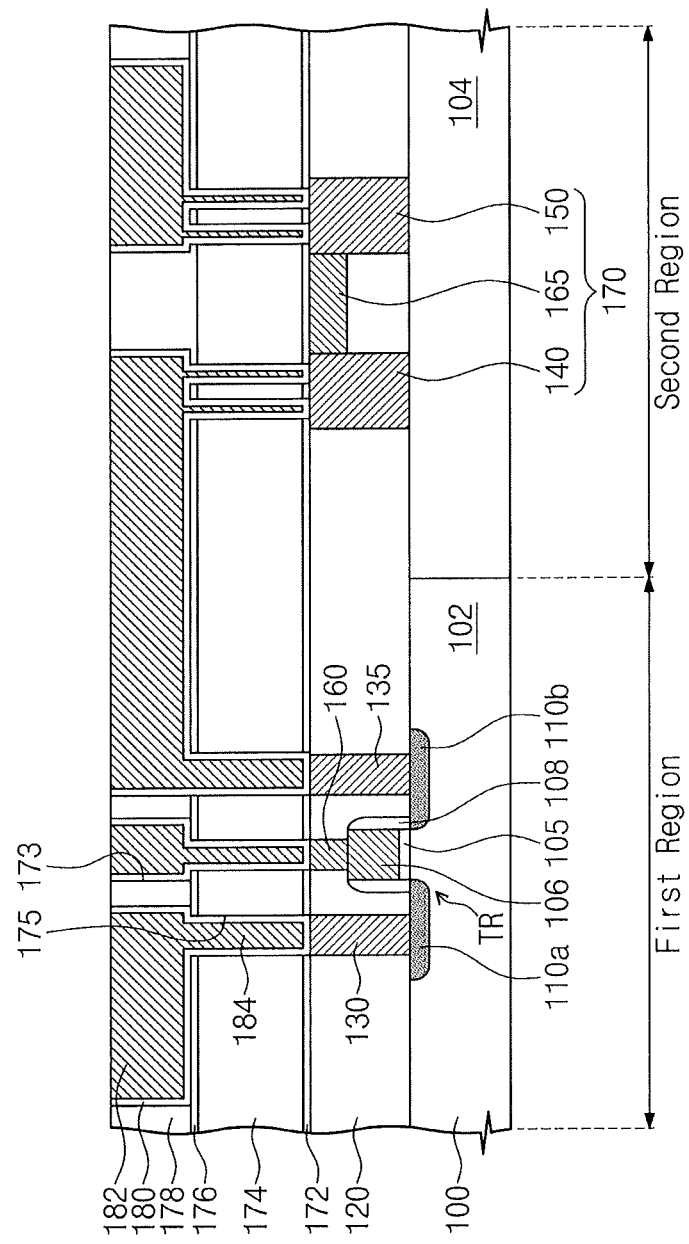

Referring to FIG. 12, a first metal barrier layer 180 may be conformally formed on the third and second interlayer insulating layers 178 and 174 having the first openings 173 and the first via holes 175, and a conductive layer may be formed on the first metal barrier layer 180 to fill the first openings 173 and the first via holes 175. Subsequently, the conductive layer and the first metal barrier layer 180 may be planarized until a top surface of the third interlayer insulating layer 178 is exposed, thereby forming first interconnection lines 182 and first interconnection vias 184. The first metal barrier layer 180 may include at least one of titanium or titanium nitride, and the conductive layer may include a metal such as copper, tungsten, or aluminum, for example. In example embodiments in accordance with principles of inventive concepts, the first metal barrier layer 180 may inhibit diffusion of the metal included in the first interconnection lines 182 and the first interconnection vias 184.

Figure 13:
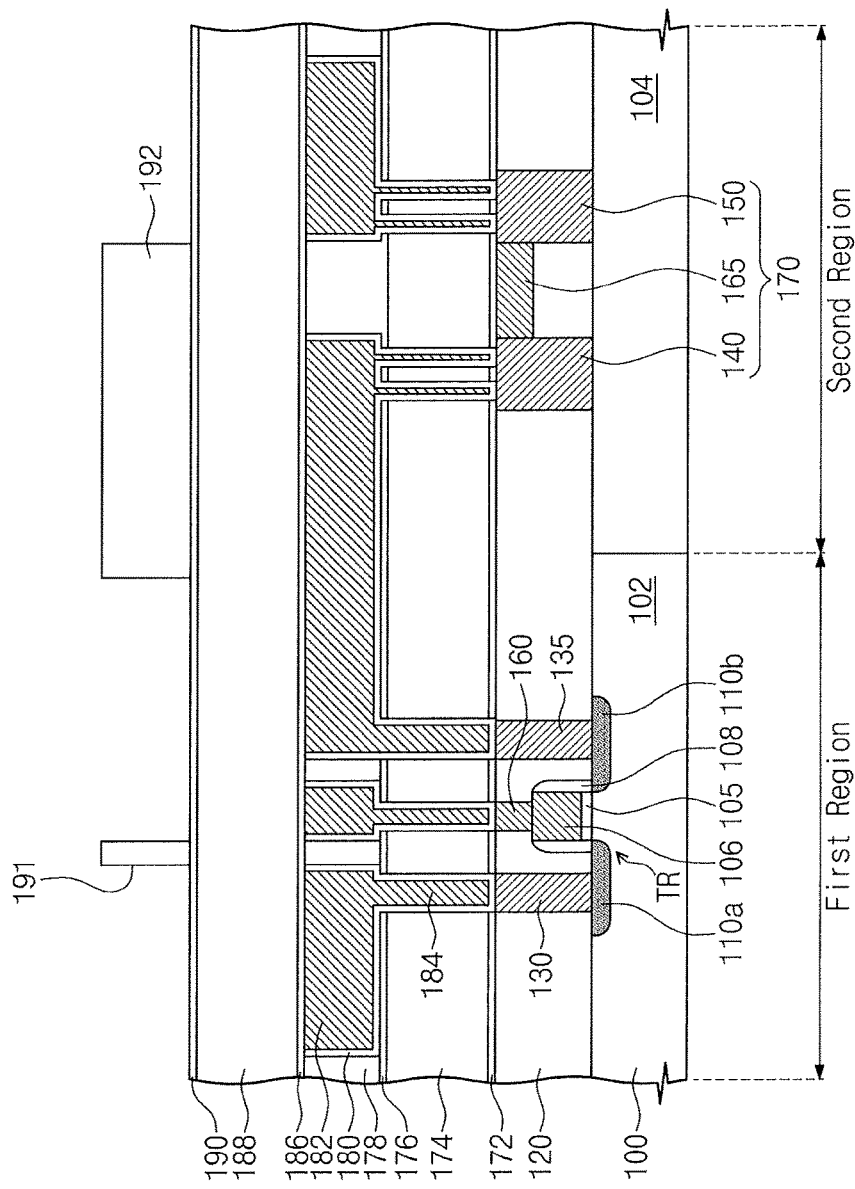

Referring to FIG. 13, a third etch stop layer 186, a fourth interlayer insulating layer 188, a fourth etch stop layer 190, and a fifth interlayer insulating layer 192 may be sequentially formed on the third interlayer insulating layer 178. The fifth interlayer insulating layer 192 may be patterned to form second openings 191 exposing portions of the fourth etch stop layer 190. The third and fourth etch stop layers 186 and 190 may include a material having the fourth and fifth interlayer insulating layers 188 and 192. For example, the fourth and fifth interlayer insulating layers 188 and 192 may include silicon oxide, and the third and fourth etch stop layers 186 and 190 may include silicon nitride.

Figure 14:
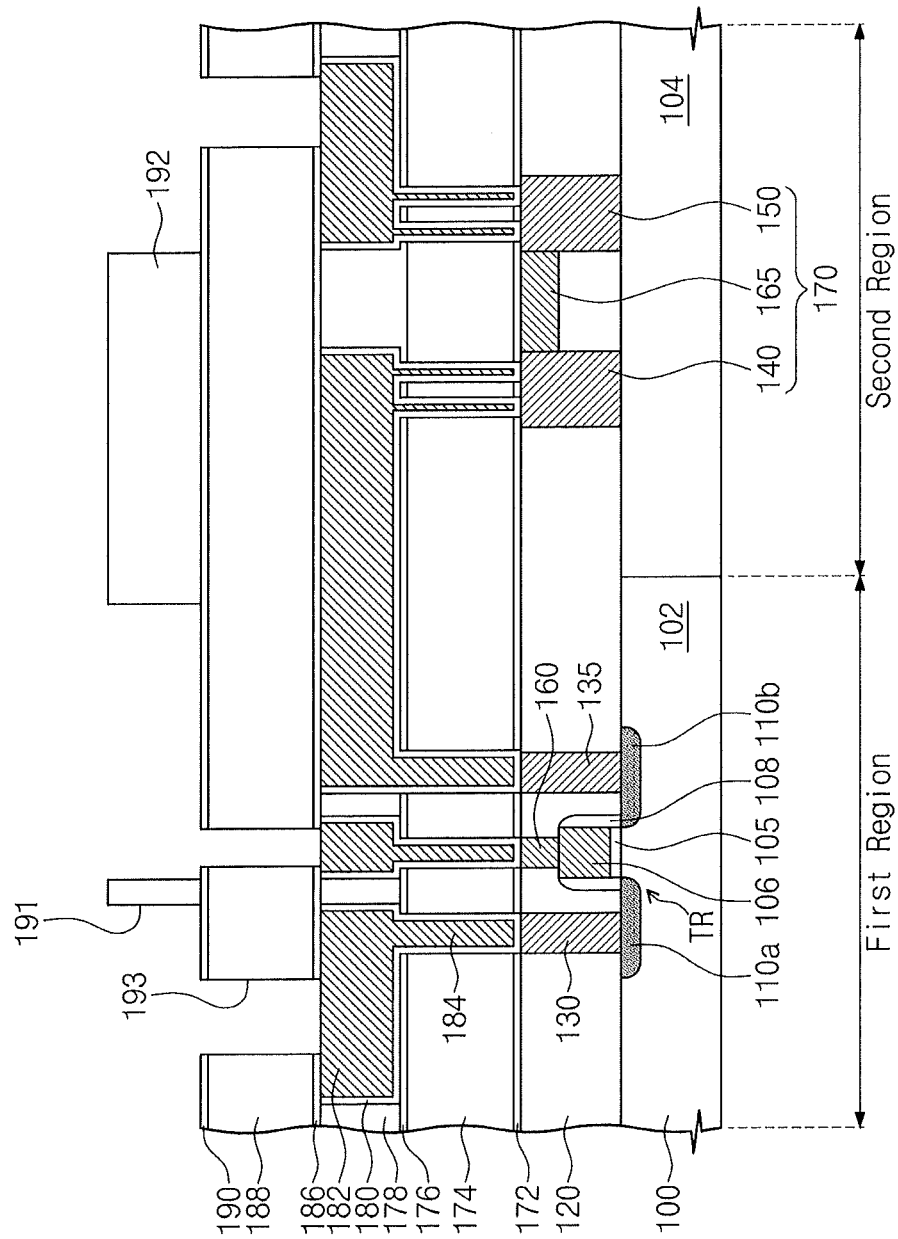

Referring to FIG. 14, the fourth etch stop layer 190, the fourth interlayer insulating layer 188, and the third etch stop layer 186, which are disposed under the second openings 191, may be patterned to form second via holes 193 that are connected to the second openings 192 and to expose he first interconnection lines 182.

Figure 15:
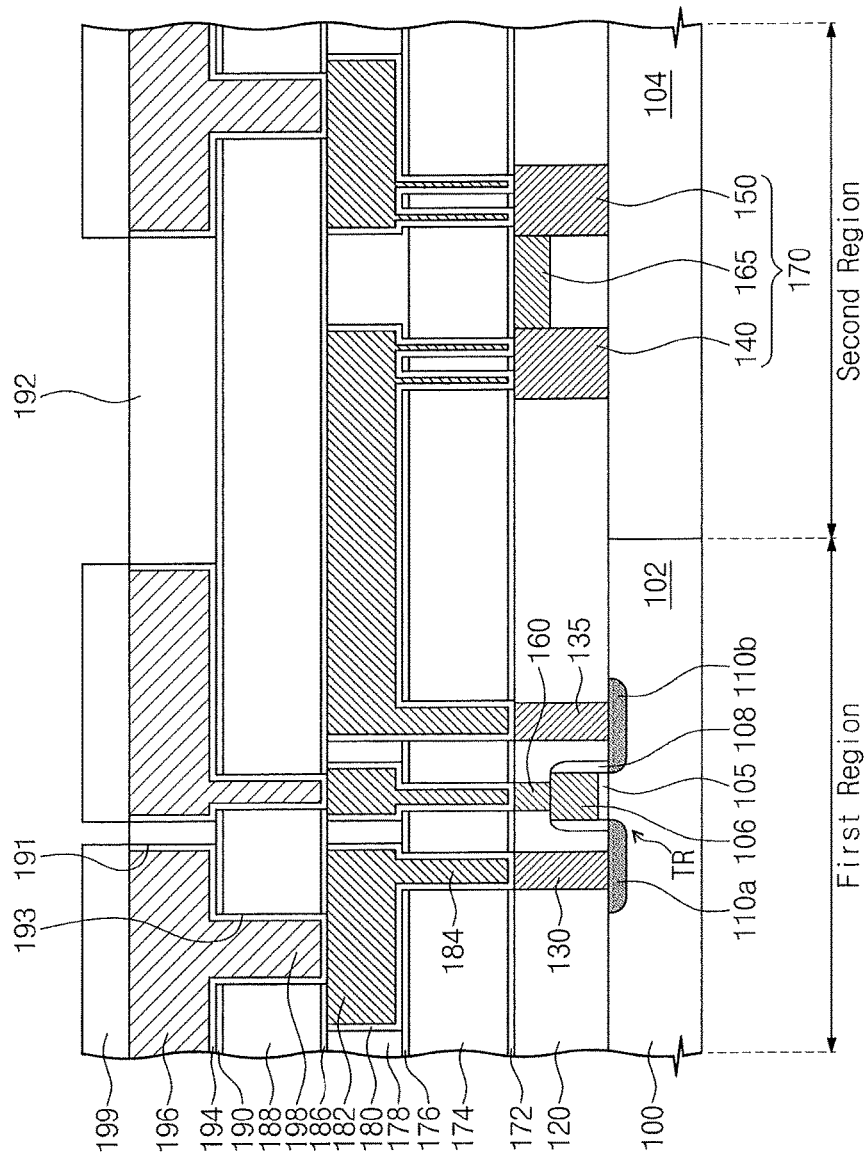

Referring to FIG. 15, a second metal barrier layer 194 may be conformally formed along inner surfaces of the second openings 191 and the second via holes 193, and a conductive layer may be formed on the second metal barrier layer 194 to fill the second openings 191 and the second via holes 193. The conductive layer and the second metal barrier layer 194 may be planarized until the fifth interlayer insulating layer 192 is exposed, thereby forming second interconnection lines 196 and second interconnection vias 198. The second interconnection lines 196 and the second interconnection vias 198 may include a metal such as copper, aluminum, or tungsten, for example. The processes of FIGS. 13 through 15 may be similar to the processes of FIGS. 9 through 12, and as a result, detailed descriptions thereof will not be repeated here.

In some example embodiments in accordance with principles of inventive concepts, capping patterns 199 may be formed on the second interconnection lines 196. The capping patterns 199 may protect the second interconnection lines 196. The capping patterns 199 may include at least one of silicon nitride, silicon oxide, or silicon oxynitride, for example.

In FIGS. 2A, 3A, 4A, 5 through 15, the planar transistor TR is illustrated as an example in the first region of the substrate 100. In the following example embodiment, a fin-type transistor may be formed in a first region of a substrate. However, embodiments in accordance with principles of the inventive concepts are not limited to the planar transistor or the fin-type transistor.

Figure 16A:
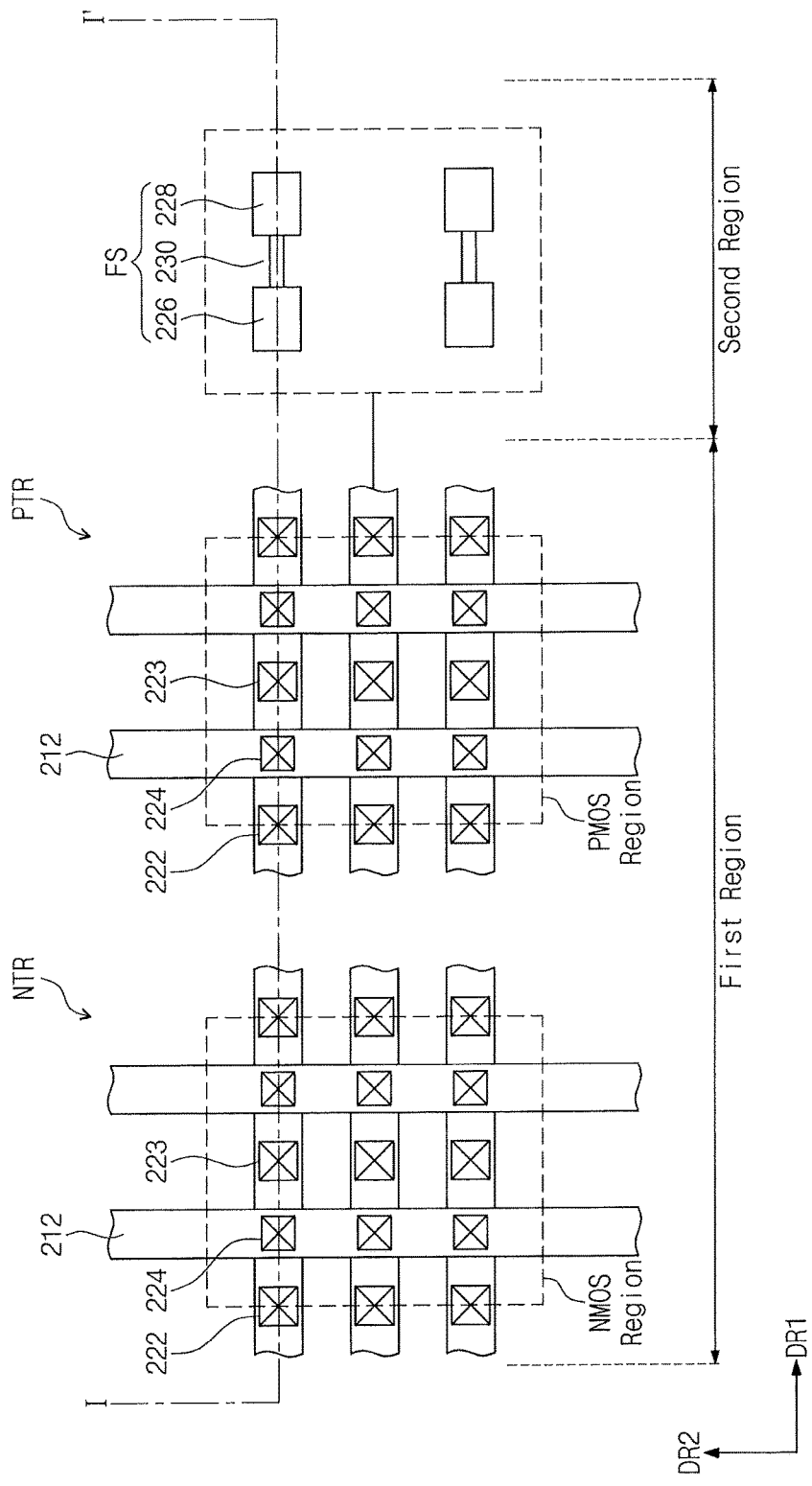
FIG. 16A is a plan view illustrating a semiconductor device according to some embodiments of the inventive concepts.
Figure 16B:
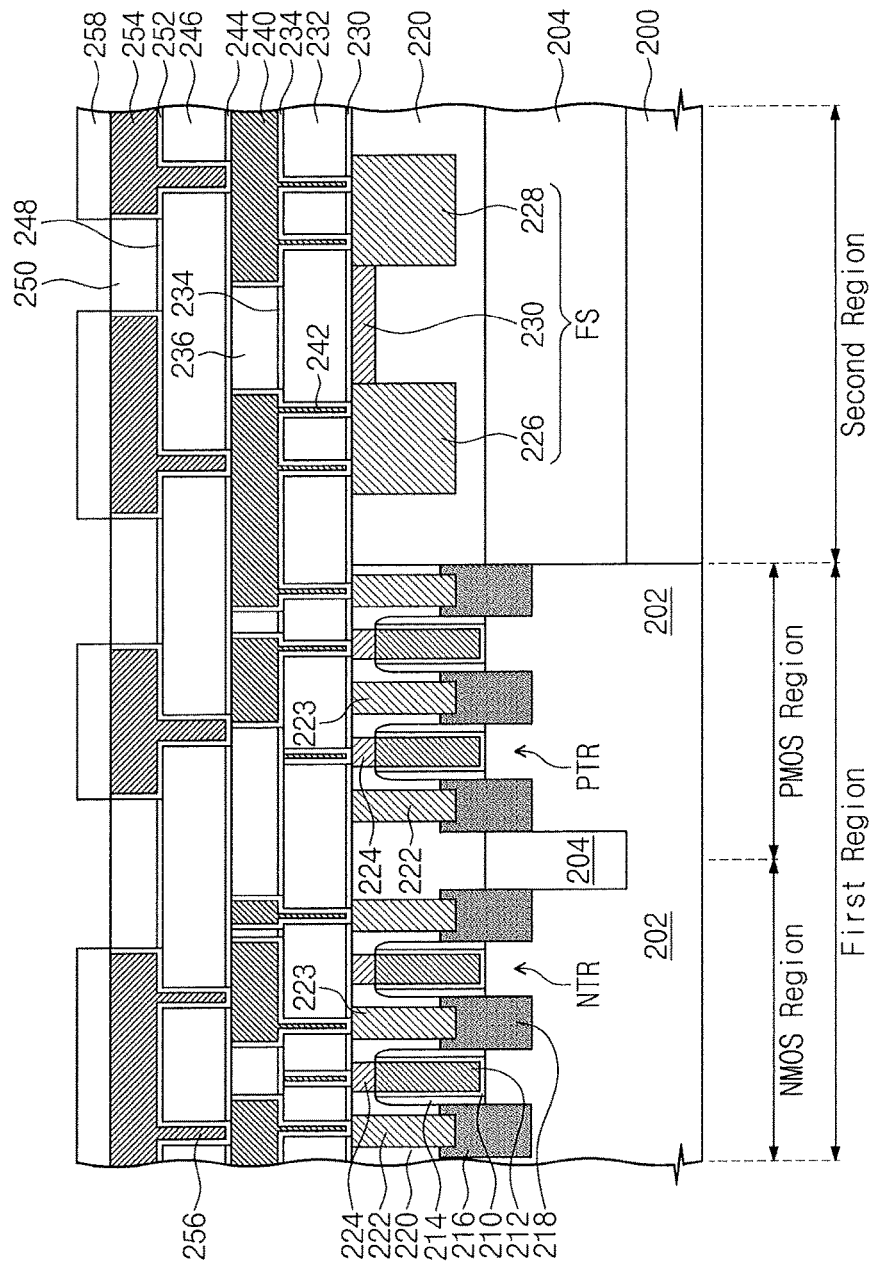
FIG. 16B is a cross-sectional view taken along a line I-I' of FIG. 16A.
Figure 16C:
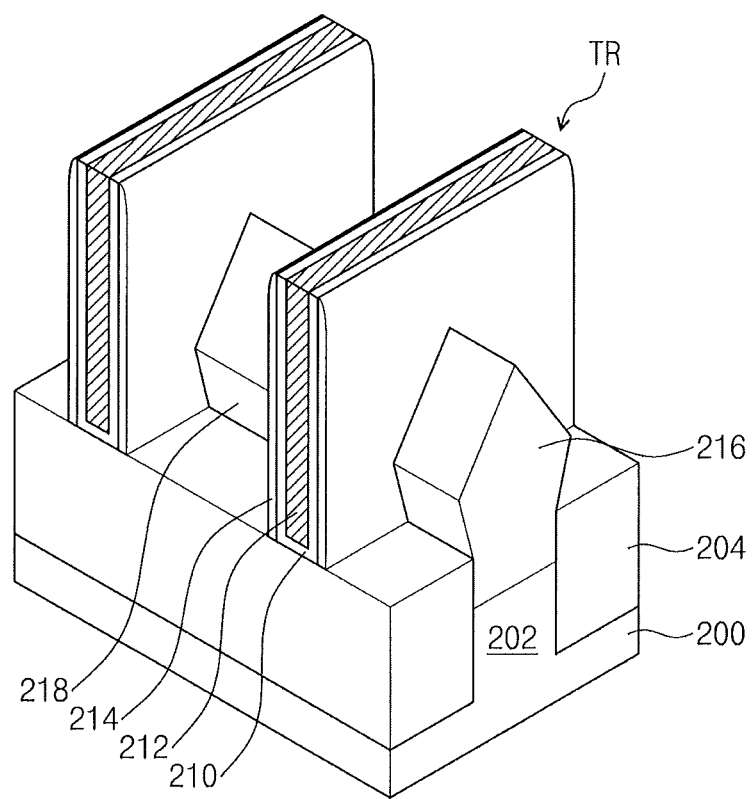
FIG. 16C is a perspective view illustrating a transistor of the semiconductor device of FIG. 16A.

FIG. 16A is a plan view illustrating a semiconductor device according to some example embodiments in accordance with principles of inventive concepts. FIG. 16B is a cross-sectional view taken along a line I-I' of FIG. 16A, FIG. 16C is a perspective view illustrating a transistor of the semiconductor device of FIG. 16A. Referring to FIGS. 16A, 16B, and 16C, a semiconductor device may include a transistor and a fuse structure that are disposed on a substrate. In the present embodiment, the transistor may be a fin-type transistor.

Referring to FIGS. 16A, 16B, and 16C, the semiconductor device may include fin-type transistors NTR and PTR and a fuse structure FS which are disposed on a substrate 200.

The substrate 200 may include a device isolation layer 204 defining active regions 202. Although not shown in detail in drawings, each of the active regions 202 may include a lower pattern extending in a first direction DR1 and upper patterns used as channel regions of the fin-type transistors. The upper patterns may be spaced apart from each other in the first direction DR1 on one lower pattern extending in the first direction DR1. Each of the upper patterns may have a pillar shape extending upward from the lower pattern. A top surface of the device isolation layer 204 may be lower than top surfaces of the upper patterns of the active regions 202. Top surfaces of the lower patterns of the active regions 202 may be substantially coplanar with the top surface of the device isolation layer 204 or may be lower than the top surface of the device isolation layer 204.

In some example embodiments in accordance with principles of inventive concepts, the fin-type transistors NTR and PTR may include, respectively, an NMOS transistor and a PMOS transistor. Although not shown in detail in the drawings, the active region 202 on which the NMOS transistor NTR is disposed may include an N-well region including silicon-germanium doped with P-type dopants. The active region 202 on which the PMOS transistor PTR is disposed may include a P-well region including silicon-germanium doped with N-type dopants.

Each of the fin-type transistors NTR and PTR may include a gate insulating layer 210, a gate electrode 212, and first and second dopant regions 216 and 218.

The gate electrodes 212 may extend in a second direction DR2 intersecting the first direction DR1 and may be spaced apart from each other in the first direction DR1. In some embodiments, the gate electrode 212 may include at least one metal layer. For example, the gate electrode 212 may include at least one of titanium, tungsten, tantalum, or aluminum. In some example embodiments in accordance with principles of inventive concepts, the gate electrode 212 may include a conductive nitride (for example, titanium nitride or tantalum nitride) and a metal (for example, aluminum or tungsten) that are sequentially stacked.

The gate insulating layer 210 may have a U-shape surrounding a bottom surface and both sidewalls of the gate electrode 212. In some example embodiments in accordance with principles of inventive concepts, the gate insulating layer 210 may include a high-k dielectric material, of which a dielectric constant is higher than that of silicon oxide. For example, the gate insulating layer 210 may include at least one of hafnium oxide, hafnium silicate, zirconium oxide, or zirconium silicate.

Spacers 214 may be disposed on both sidewalls of the gate electrode 212. The spacers 214 may extend in the second direction DR2. In such embodiments, the gate insulating layer 210 may be disposed between the gate electrode 212 and the spacer 214. The spacer 214 may include at least one of silicon nitride or silicon oxynitride.

The first and second dopant regions 216 and 218 may be formed by performing an epitaxial growth process on the active regions 202 exposed by the gate electrode 212. In some example embodiments, each of the first and second dopant regions 216 and 218 may be formed on the lower pattern exposed between the upper patterns adjacent to each other of the active region 202. Top surfaces of the first and second dopant regions 216 and 218 may be higher than a top surface of the substrate 200 (that is, the top surfaces of the upper patterns of the active region 202).

In some example embodiments, the first and second dopant regions 216 and 218 of the NMOS transistor NTR may be formed to include silicon or silicon carbide having tensile force by performing the epitaxial growth process using a silicon source gas as a process gas.

In some example embodiments, the first and second dopant regions 216 and 218 of the PMOS transistor PTR may be formed to include silicon-germanium having compressive force by performing the epitaxial growth process using silicon and germanium source gases as a process gas. First and second contact plugs 222 and 223 may be disposed in the first region of the substrate 200 so as to be connected to the first and second dopant regions 216 and 218 of the transistor NTR and/or PTR. The first and second contact plugs 222 and 223 may have the substantially same height (that is, a first height). Top surfaces of the first and second contact plugs 222 and 223 may be substantially coplanar with each other. A third contact plug 224 may be disposed in the first region so as to be electrically connected to the gate electrode 212. The third contact plug 224 may have a second height, lower than the first height, and a top surface of the third contact plug 224 may be substantially coplanar with the top surfaces of the first and second contact plugs 222 and 223.

The fuse structure FS may include a first fuse contact plug 226, a second fuse contact plug 228, and a connection pattern 230. The first and second fuse contact plugs 226 and 228 may have the substantially same height (that is, the first height) as the first and second contact plugs 222 and 223, and the connection pattern 230 may have the substantially same height (that is, the second height) as the third contact plug 224. In some example embodiments, the first and second fuse contact plugs 226 and 228 may be formed during formation of the first and second contact plugs 222 and 223. In addition, the connection pattern 230 may be formed during formation of the third contact plug 224.

A first interlayer insulating layer 220 may cover the transistors NTR and PTR, the first to third contact plugs 222, 223, and 224, and the fuse structure FS. A top surface of the first interlayer insulating layer 220 may be substantially coplanar with the top surfaces of the first to third contact plugs 222, 223, and 224 and the top surface of the fuse structure FS.

Second to fifth interlayer insulating layers 232, 236, 246, and 250 may be sequentially stacked on the first interlayer insulating layer 220, and etch stop layers 230, 234, 244, and 248 may be disposed between the first to fifth interlayer insulating layers 220, 232, 236, 246, and 250. An interconnection structure 238, 240, 242, 252, 254, and 256 may be disposed in the second to fifth interlayer insulating layers 232, 236, 246, and 250. The interconnection structure 238, 240, 242, 252, 254, and 256 may include a first interconnection structure 238, 240, and 242 and a second interconnection structure 252, 254, and 256. The first interconnection structure 238, 240, and 242 may be disposed in the second and third interlayer insulating layers 232 and 236 and may be electrically connected to the first and second contact plugs 222 and 223 and the first and second fuse contact plugs 226 and 228. The second interconnection structure 252, 254, and 256 may be disposed in the fourth and fifth interlayer insulating layers 246 and 250 and may be electrically connected to the first interconnection structure 238, 240, and 242.

The first interconnection structure 238, 240, and 242 may include first interconnection vias 242 and first interconnection lines 240 which may be formed using a damascene process. For example, the first interconnection vias 242 may penetrate the second interlayer insulating layer 232, the first interconnection lines 240 may penetrate the third interlayer insulating layer 236, and the etch stop layer 234 may be disposed between the second and third interlayer insulating layers 232 and 236. In addition, the first interconnection structure 238, 240, and 242 may further include a first metal barrier layer 238 surrounding outer sidewalls of the first interconnection via 242 and the first interconnection line 240.

The second interconnection structure 252, 254, and 256 may include second interconnection vias 256 and second interconnection lines 254 which may be formed using a damascene process. For example, the second interconnection vias 256 may penetrate the fourth interlayer insulating layer 246, the second interconnection lines 240 may penetrate the fifth interlayer insulating layer 250, and the etch stop layer 238 may be disposed between the fourth and fifth interlayer insulating layers 246 and 250. In addition, the second interconnection structure 252, 254, and 256 may further include a second metal barrier layer 252 surrounding outer sidewalls of the second interconnection via 256 and the second interconnection line 254.

Capping patterns 258 may be disposed on the second interconnection structure 252, 254, and 256 to protect the second interconnection structure 252, 254, and 256.

Other components of the semiconductor device of FIGS. 16A through 16C except the fin-type transistors may be the same as, or similar to, corresponding components of the semiconductor device described with reference to FIGS. 2A through 15.

According to some example embodiments in accordance with principles of inventive concepts, the fuse structure may be formed in the MOL processes, rather than the BEOL processes. Because process variables may be subject to greater variation during BEOL processes, the influence of process variables on the fuse structure may be reduced or minimized when a fuse structure is formed during the MOL processes in accordance with principles of inventive concepts. In addition, the operation of the fuse structure may be verified early in the MOL processes, rather than the BEOL processes.

In addition, because the fuse structure of the second region is formed during the formation of the contact plugs of the first region, it may be formed without requiring an additional process. Furthermore, because the contact plugs may be formed of tungsten, the fuse structure may also include tungsten.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. As a result, the scope of inventive concepts is to be determined by the broadest permissible interpretation of the following claims and their equivalents, and shall not be restricted or limited by the foregoing description.

What is claimed is:

1. A semiconductor device comprising:
   a substrate including a first region and a second region;
   a transistor comprising a gate electrode and first and second dopant regions that are disposed on the first region of the substrate;
   first, second, and third contact plugs electrically connected to the first dopant region, the second dopant region, and the gate electrode, respectively; and
   a fuse structure disposed on the second region of the substrate, the fuse structure comprising: first and second fuse contact plugs having a same height as the first and second contact plugs; and a connection pattern having a same height as the third contact plug,
   wherein the connection pattern is connected between the first and second fuse contact plugs,
   wherein top surfaces of the first and second contact plugs are substantially coplanar with a top surface of the third contact plug, and
   wherein the top surface of the third contact plug is substantially coplanar with a top surface of the connection pattern.

2. The semiconductor device of claim 1, wherein top surfaces of the first and second contact plugs are substantially coplanar with top surfaces of the first and second fuse contact plugs.

3. The semiconductor device of claim 1, wherein the first and second contact plugs and the first and second fuse contact plugs have a first height,
   wherein the third contact plug and the connection pattern have a second height, and
   wherein the first height is greater than the second height.

4. The semiconductor device of claim 1, wherein the first and second contact plugs include a same conductive material as the first and second fuse contact plugs, and
   wherein the third contact plug includes the same conductive material as the connection pattern.

5. The semiconductor device of claim 4, wherein the conductive material of the first and second contact plugs and the first and second fuse contact plugs includes tungsten, and
   wherein the conductive material of the third contact plug and the connection pattern includes tungsten.

6. The semiconductor device of claim 1, wherein widths of the first and second fuse contact plugs are greater than a width of the connection pattern when viewed from a plan view.

7. The semiconductor device of claim 1, further comprising:
   first interconnection vias disposed on the first fuse contact plug;
   second interconnection vias disposed on the second fuse contact plug; and
   interconnection lines electrically connected to the first and second interconnection vias.

8. The semiconductor device of claim 7, wherein sizes of the first and second fuse contact plugs are substantially equal to each other when viewed from a plan view,
   wherein sizes of the first and second interconnection vias are substantially equal to each other when viewed from a plan view, and
   wherein a number of the first interconnection vias is equal to a number of the second interconnection vias.

9. The semiconductor device of claim 7, wherein a size of the first fuse contact plug is greater than that of the second fuse contact plug when viewed from a plan view, and
   wherein a number of the first interconnection vias is more than a number of the second interconnection vias.

10. The semiconductor device of claim 7, wherein a size of the first fuse contact plug is greater than that of the second fuse contact plug when viewed from a plan view, and
    wherein sizes of the first interconnection vias are greater than those of the second interconnection vias.

11. The semiconductor device of claim 1, further comprising:
    interconnection vias electrically connected to the first to third contact plugs, respectively; and
    interconnection lines electrically connected to the interconnection vias.

* * * * *